(12) United States Patent
Yoneda et al.

(10) Patent No.: US 8,637,329 B2
(45) Date of Patent: Jan. 28, 2014

(54) METHOD FOR PRODUCING SEMICONDUCTOR OPTICAL INTEGRATED DEVICE

(75) Inventors: Yoshihiro Yoneda, Yokohama (JP); Hirohiko Kobayashi, Yokohama (JP); Kenji Koyama, Yokohama (JP); Masaki Yanagisawa, Yokohama (JP); Kenji Hiratsuka, Yokohama (JP)

(73) Assignee: Sumitomo Electric Industries Ltd, Osaka (JP)

( * ) Notice: Subject to any disclaimer, the term of this patent is extended or adjusted under 35 U.S.C. 154(b) by 22 days.

(21) Appl. No.: 13/537,221

(22) Filed: Jun. 29, 2012

(65) Prior Publication Data

US 2013/0012002 A1 Jan. 10, 2013

(30) Foreign Application Priority Data

Jul. 4, 2011 (JP) ................................. 2011-148491

(51) Int. Cl.
*H01L 21/027* (2006.01)
*H01L 33/00* (2010.01)

(52) U.S. Cl.
USPC ............... 438/22; 438/24; 438/31; 438/32; 257/79; 257/80; 257/98; 257/623; 257/E25.032; 257/E33.001

(58) Field of Classification Search
USPC ........... 438/22–24, 29, 31–32, 34–37, 45–47; 257/21, 79–82, 88, 91, 94, 96–98, 618, 257/623, E25.032, E33.001, E33.008, 257/E33.023, E33.025–E33.026, 257/E33.028–E33.034, E33.049
See application file for complete search history.

(56) References Cited

U.S. PATENT DOCUMENTS

| | | | | |
|---|---|---|---|---|
| 5,937,273 A | * | 8/1999 | Fujii et al. ........................ | 438/46 |
| 5,987,046 A | * | 11/1999 | Kobayashi et al. ......... | 372/45.01 |
| 6,678,302 B2 | * | 1/2004 | Nakamura ................... | 372/50.1 |
| 7,112,827 B2 | * | 9/2006 | Hayakawa et al. ........... | 257/116 |

(Continued)

FOREIGN PATENT DOCUMENTS

JP 4-199689 7/1992

OTHER PUBLICATIONS

"Monolithic Integration of a 10 Gb/s Mach-Zehnder Modulator and a Widely Tunable Laser based on a 2-Ring Loop-Filter", T. Okamoto, K. Mizutani, K. Tsuruoka, S. Sudo, M. Sato, K. Kudo, T. Kato and K. Sato, Nanoelectronics Research Laboratories, NEC Corporation.*

*Primary Examiner* — Laura Menz
*Assistant Examiner* — Maliheh Malek
(74) *Attorney, Agent, or Firm* — Smith, Gambrell & Russell, LLP

(57) ABSTRACT

A method for producing a semiconductor optical integrated device includes the steps of forming a substrate product including first and second stacked semiconductor layer portions; forming a first mask on the first and second stacked semiconductor layer portions, the first mask including a stripe-shaped first pattern region and a second pattern region, the second pattern region including a first end edge; forming a stripe-shaped mesa structure; removing the second pattern region of the first mask; forming a second mask on the second stacked semiconductor layer portion; and selectively growing a buried semiconductor layer with the first and second masks. The second mask includes a second end edge separated from the first end edge of the first mask, the second end edge being located on the side of the second stacked semiconductor layer portion in the predetermined direction with respect to the first end edge of the first mask.

11 Claims, 30 Drawing Sheets

(56) References Cited

U.S. PATENT DOCUMENTS

| | | | |
|---|---|---|---|
| 8,236,590 B2* | 8/2012 | Matsui et al. | 438/31 |
| 2002/0004255 A1* | 1/2002 | Kim | 438/47 |
| 2003/0086464 A1* | 5/2003 | Ishikawa et al. | 372/46 |
| 2008/0219315 A1* | 9/2008 | Makino et al. | 372/50.1 |
| 2008/0317422 A1* | 12/2008 | Kitatani et al. | 385/129 |
| 2009/0074020 A1* | 3/2009 | Matsui et al. | 372/34 |
| 2010/0303115 A1* | 12/2010 | Yagi et al. | 372/46.012 |
| 2010/0311195 A1* | 12/2010 | Matsui et al. | 438/31 |
| 2011/0292960 A1* | 12/2011 | Shoji et al. | 372/50.11 |
| 2012/0148184 A1* | 6/2012 | Yoneda et al. | 385/2 |
| 2012/0183007 A1* | 7/2012 | Roggero et al. | 372/50.23 |
| 2012/0270347 A1* | 10/2012 | Yagi | 438/31 |
| 2012/0308173 A1* | 12/2012 | Yagi | 385/2 |
| 2012/0309121 A1* | 12/2012 | Yoneda et al. | 438/31 |
| 2013/0058371 A1* | 3/2013 | Yoneda et al. | 372/50.11 |
| 2013/0064497 A1* | 3/2013 | Iwai et al. | 385/14 |
| 2013/0177037 A1* | 7/2013 | Yagi | 372/50.1 |
| 2013/0183783 A1* | 7/2013 | Katsuyama | 438/47 |

* cited by examiner

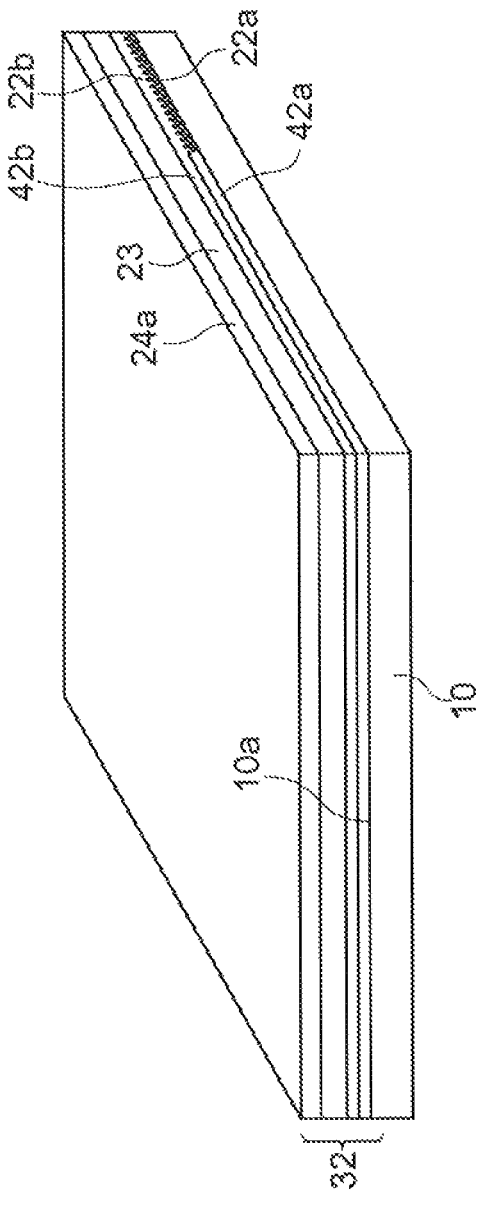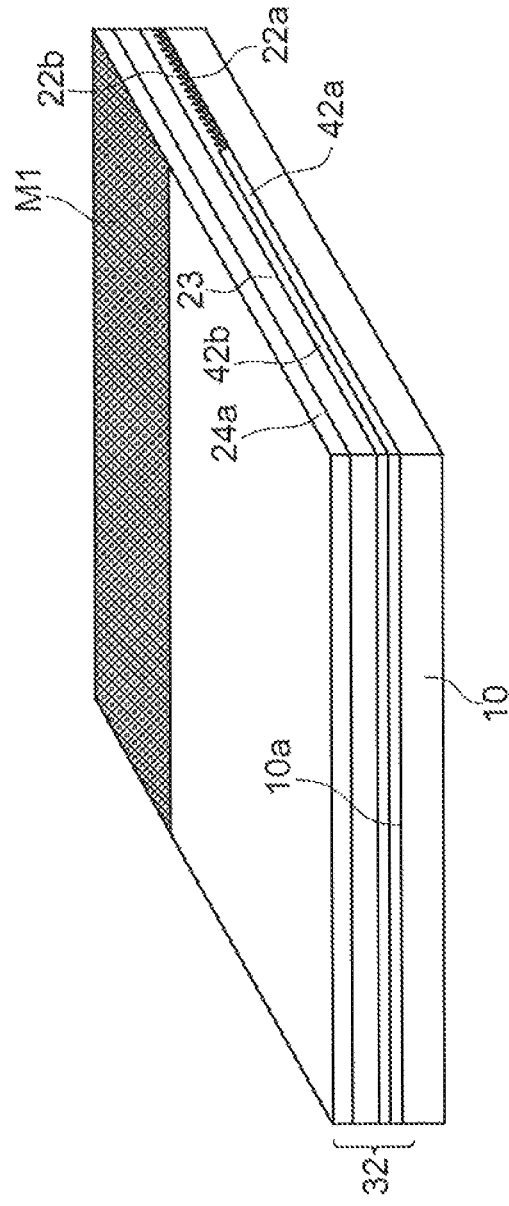

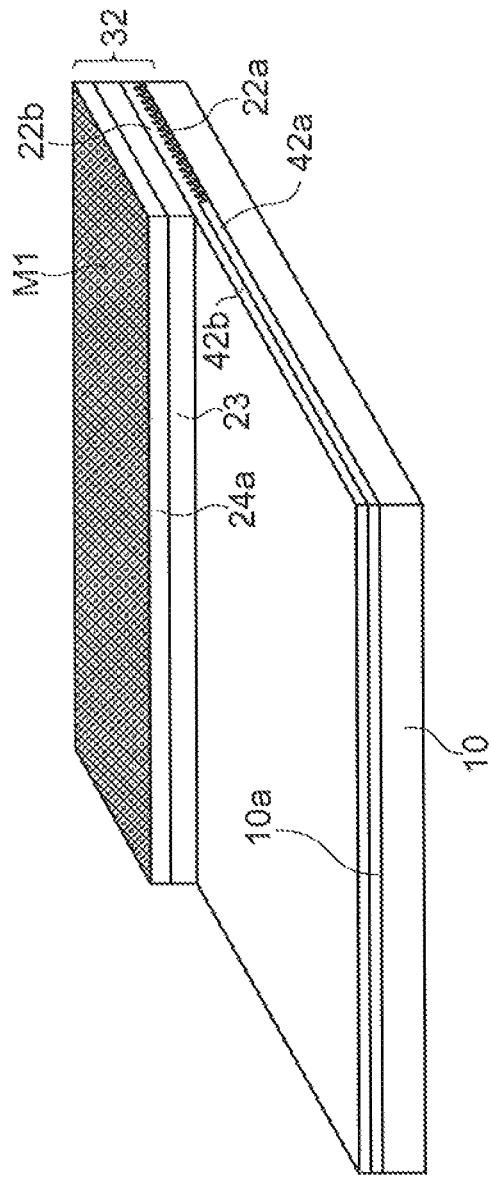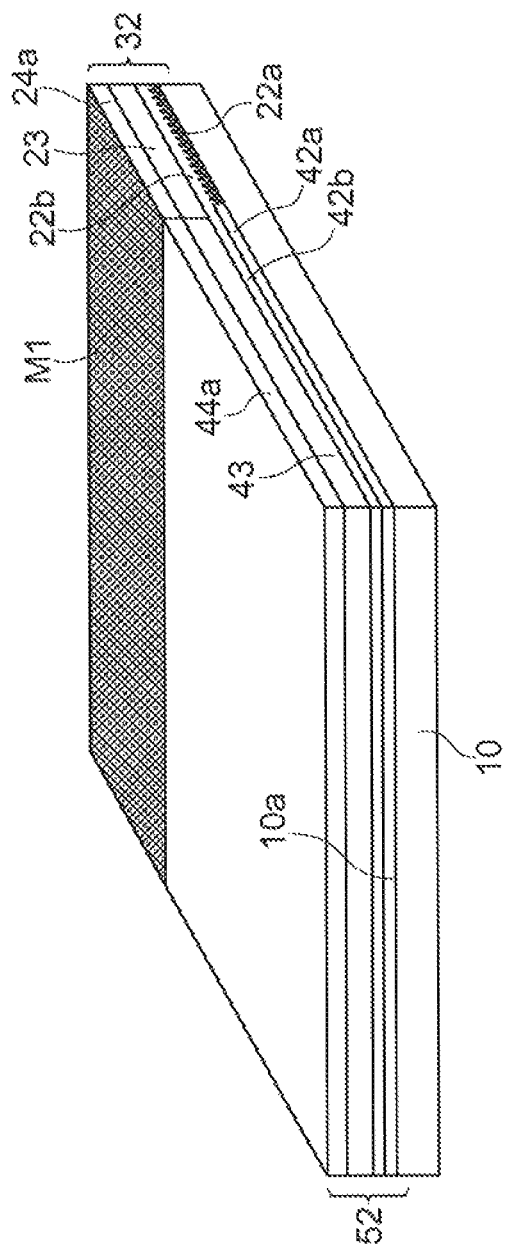

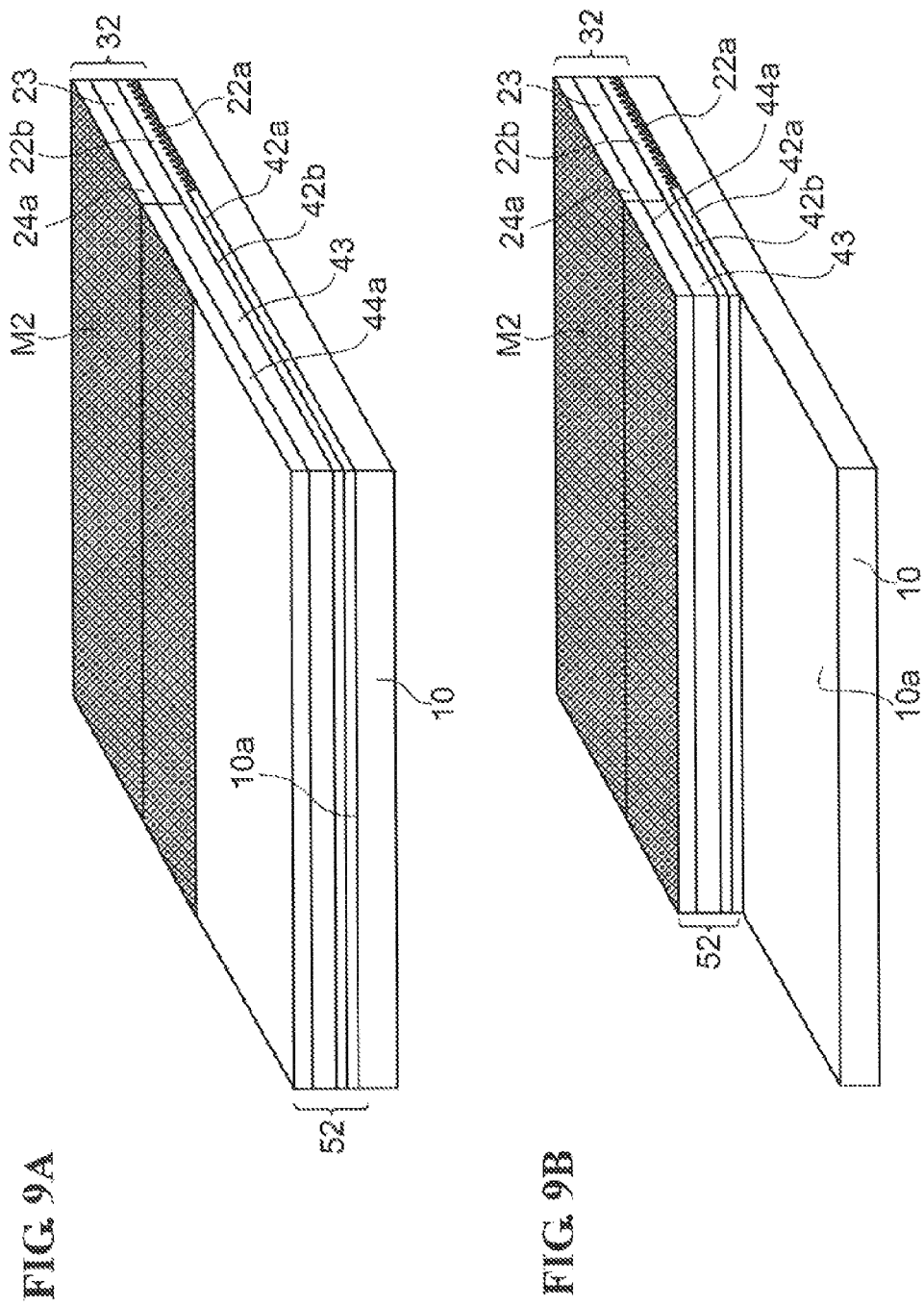

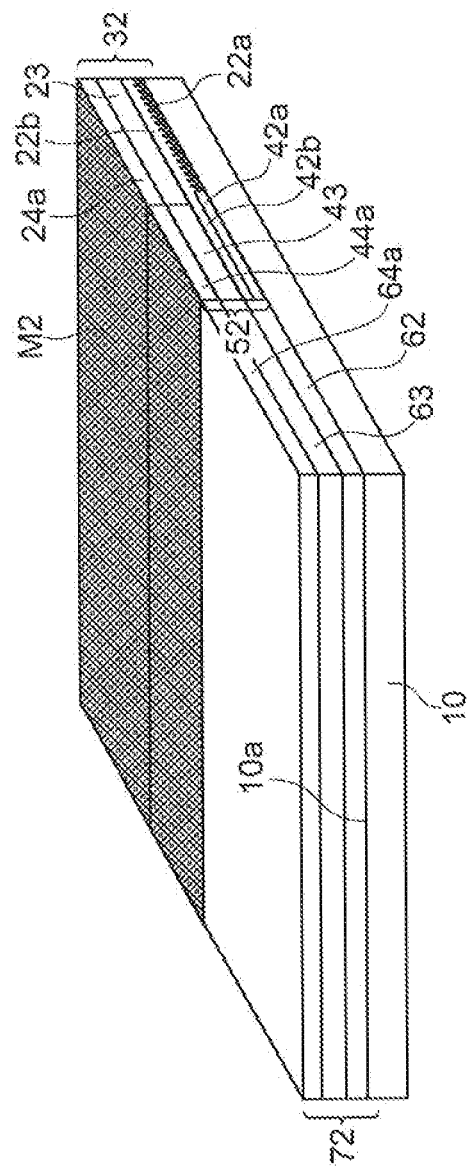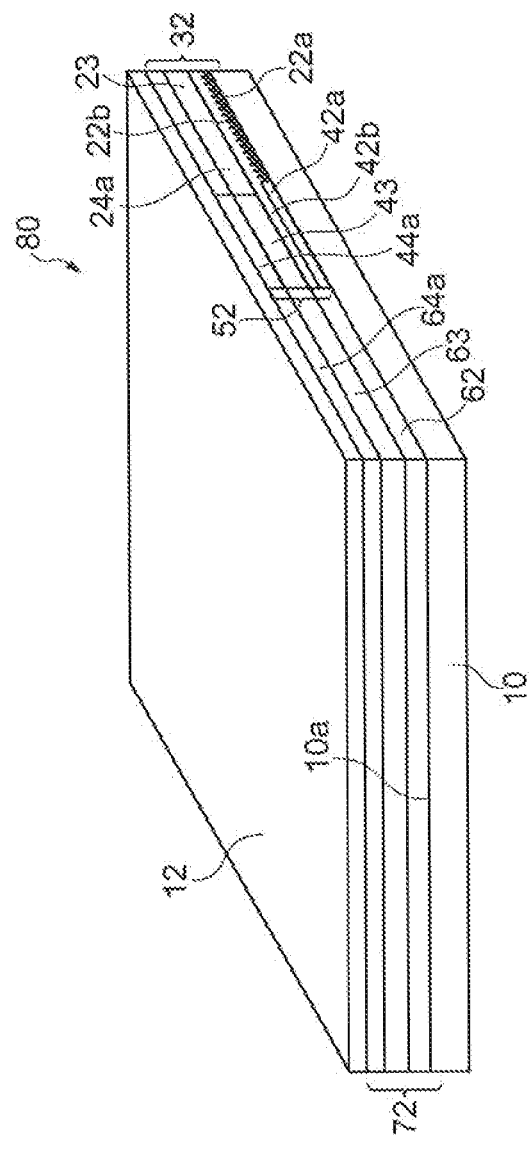

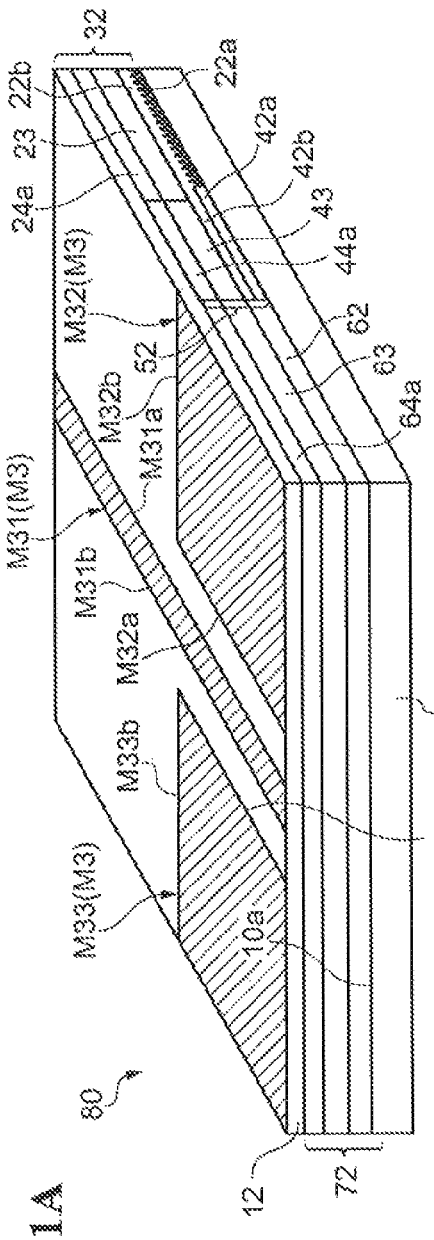
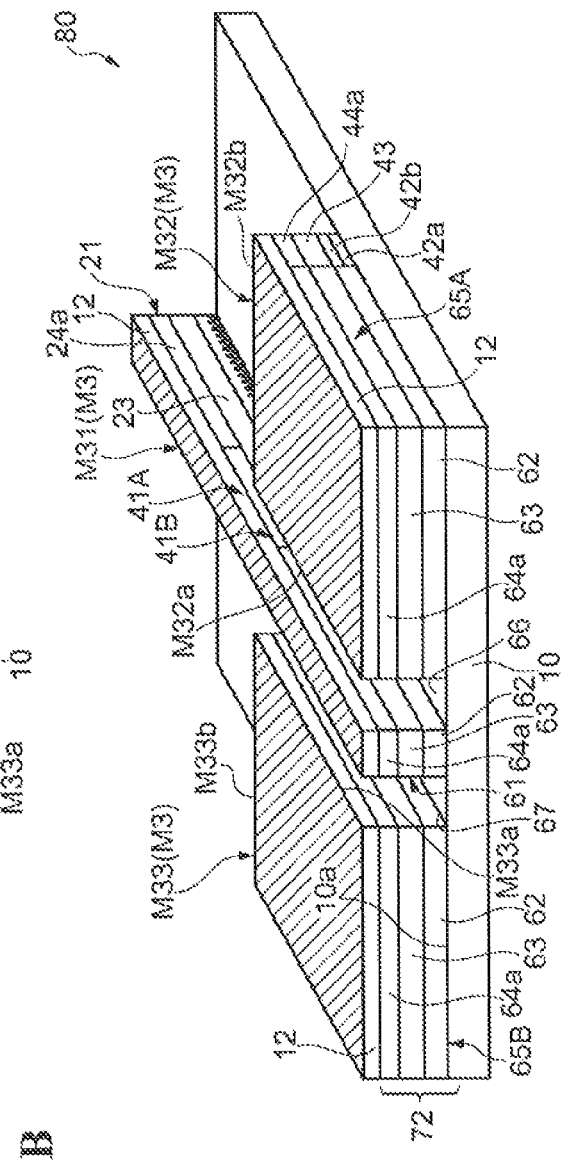
FIG. 11A
FIG. 11B

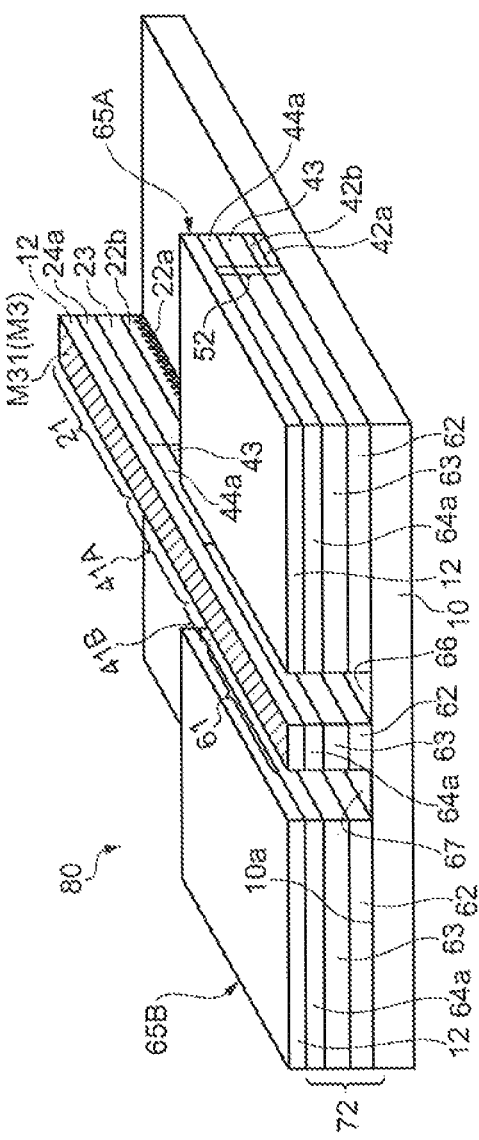
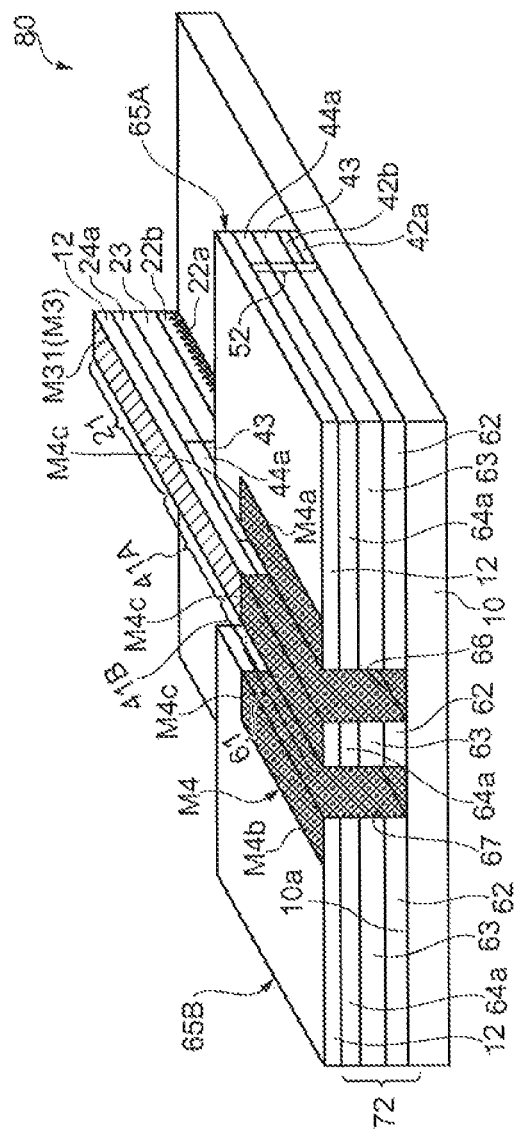
FIG. 12A
FIG. 12B

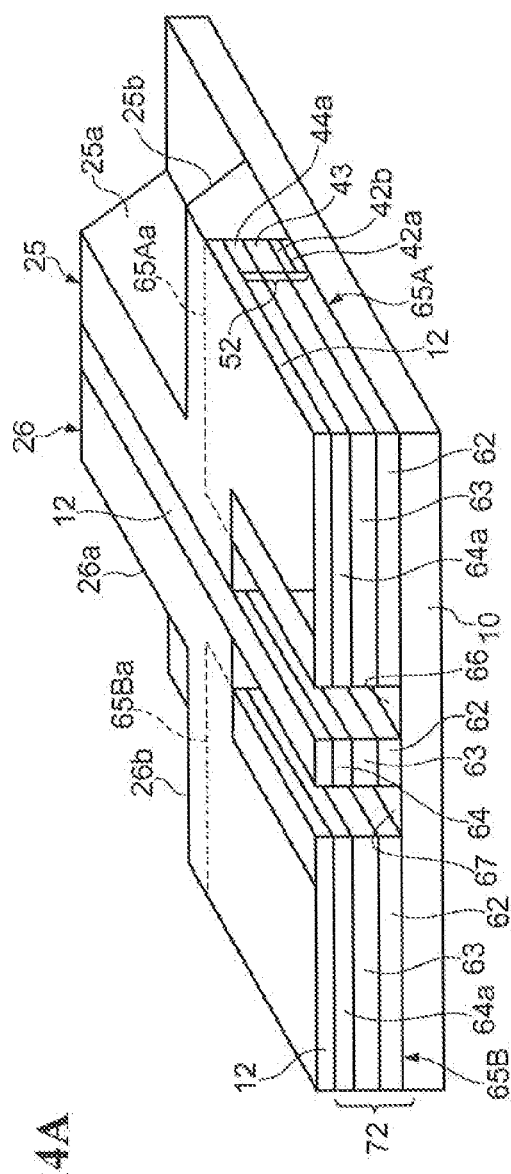
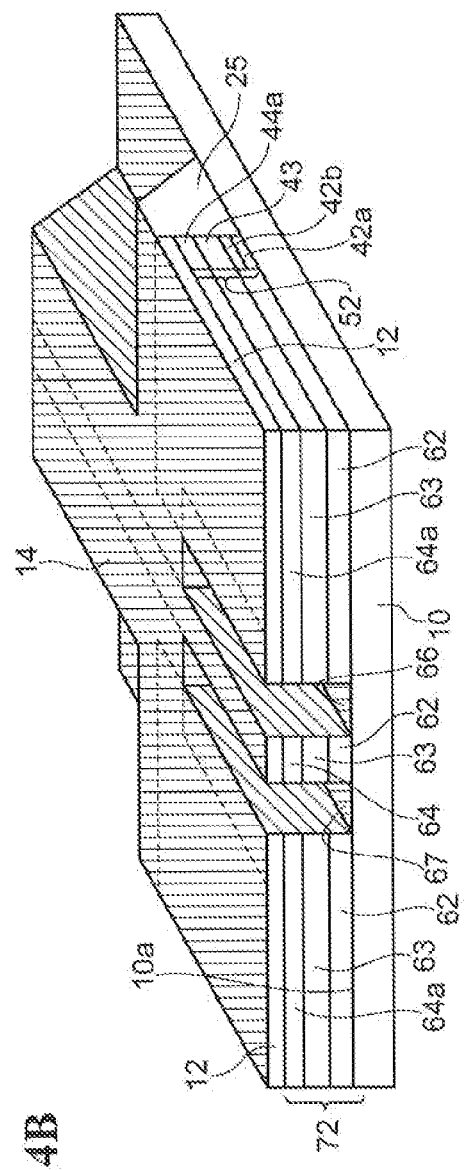
FIG. 14A
FIG. 14B

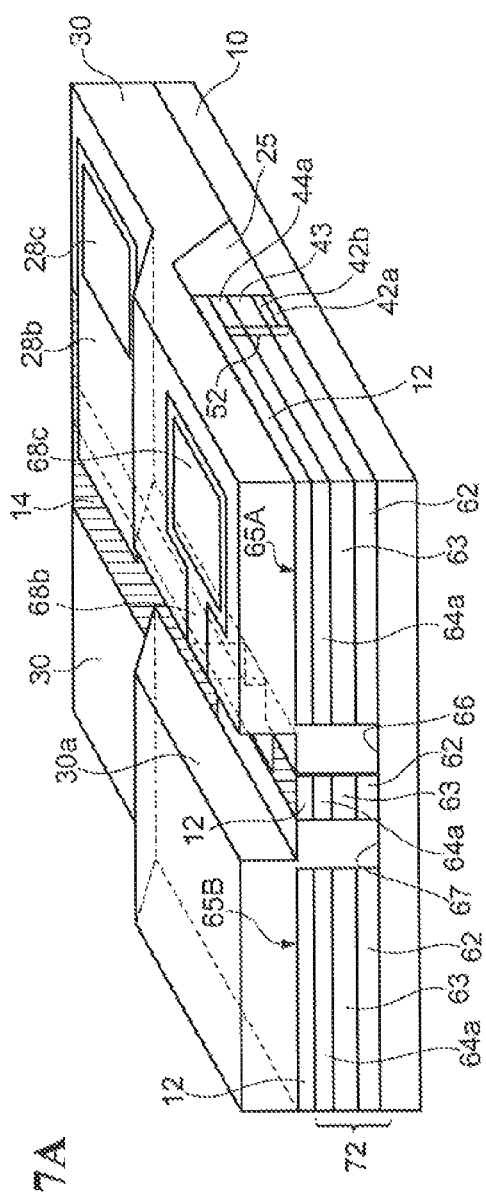
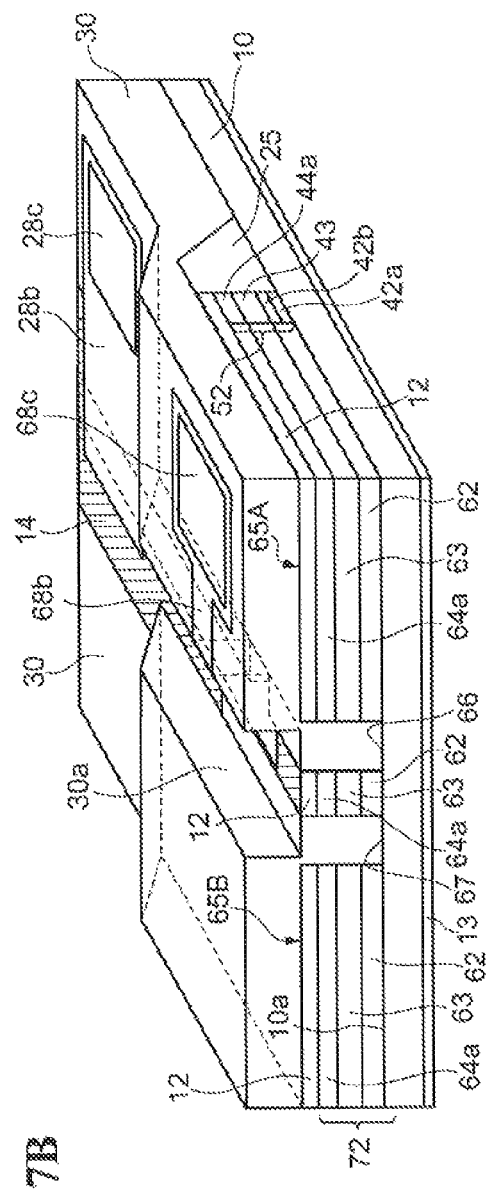
FIG. 17A
FIG. 17B

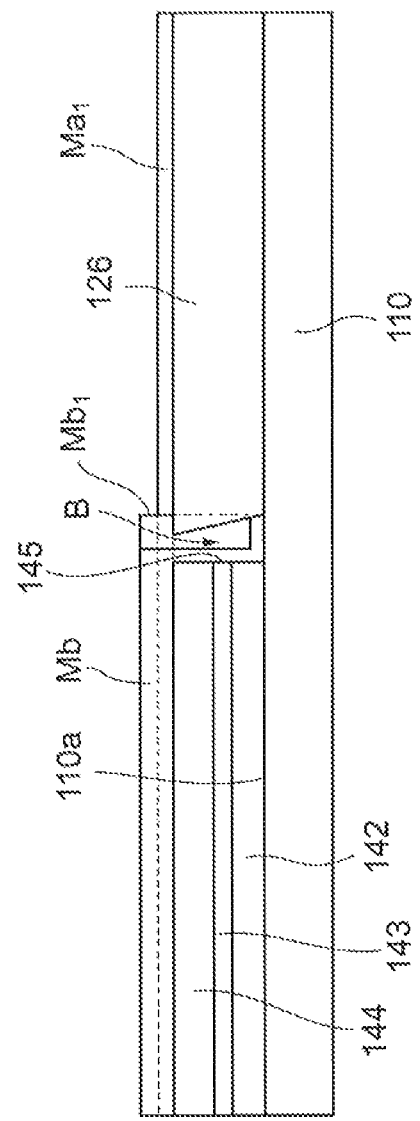

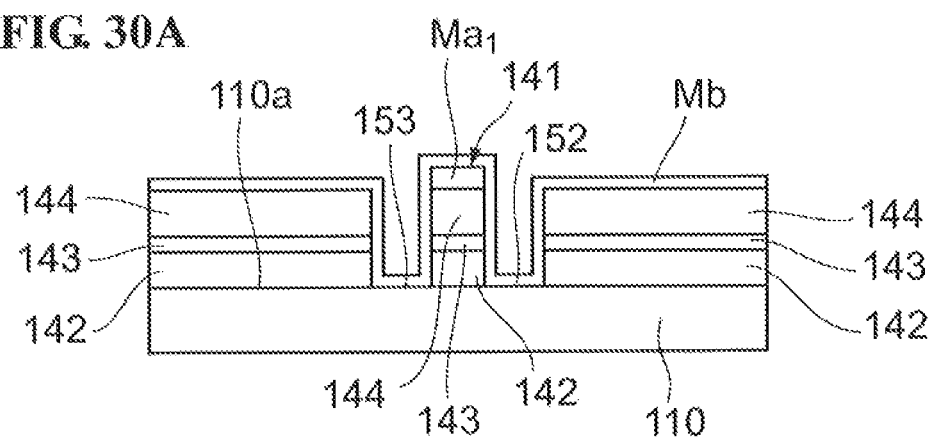
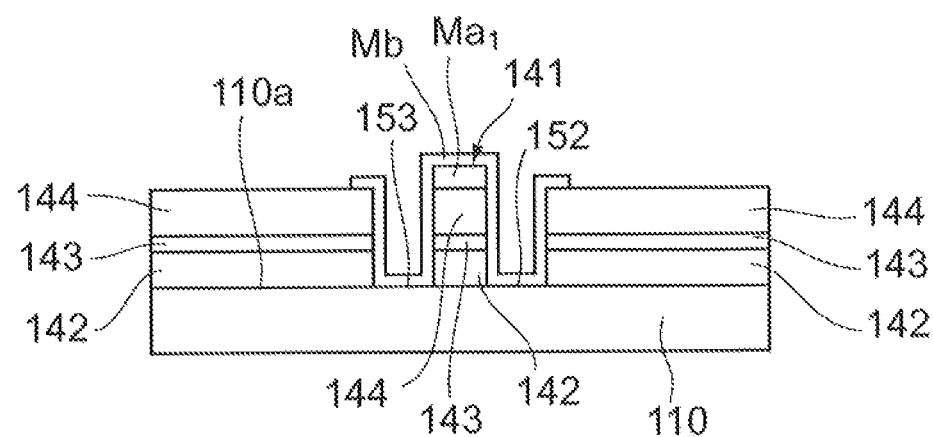

US 8,637,329 B2

METHOD FOR PRODUCING SEMICONDUCTOR OPTICAL INTEGRATED DEVICE

BACKGROUND OF THE INVENTION

1. Field of the Invention

The present invention relates to a method for producing a semiconductor optical integrated device.

2. Description of the Related Art

Japanese Unexamined Patent Application Publication No. 4-199689 discloses an optical waveguide device in which two optical elements, i.e., a semiconductor laser portion and an optical modulator portion, are monolithically integrated. In this optical waveguide device, each of the semiconductor laser portion and the optical modulator portion has a structure in which a buffer layer composed of InGaAsP, a protective layer composed of InP, a core layer composed of InGaAsP, and a cladding layer composed of InP are stacked, in that order, on one InP substrate. The core layer of the semiconductor laser portion functions as an active layer that generates light. The core layer of the optical modulator portion functions as a light absorbing layer that absorbs light propagating from the semiconductor laser portion. The core layer (light absorbing layer) of the optical modulator portion is directly connected to the core layer (active layer) of the semiconductor laser portion by a butt-joint method. The butt-joint connection between the core layer of the optical modulator portion and the core layer of the semiconductor laser portion is formed by epitaxial growth. Furthermore, in the optical waveguide device, a stripe-shaped mesa structure extending in the direction of light propagation is formed. The stripe-shaped mesa structure includes the core layer of each of the semiconductor laser portion and the optical modulator portion. A buried layer configured to planarize a surface of the device is formed on each side surface of the stripe-shaped mesa structure.

SUMMARY OF THE INVENTION

A semiconductor optical integrated device produced by the butt-joint method has a structure in which both side surfaces of a stripe-shaped mesa structure formed in two or more optical portions are buried in the same buried layers (for example, semi-insulating semiconductor layers) like the device described in Japanese Unexamined Patent Application Publication No. 4-199689. Alternatively, with respect to both side surfaces of a stripe-shaped mesa structure extending through two or more optical portions, a structure in which side surfaces of optical portions are buried in different buried layers may be used. For example, both side surfaces of a stripe-shaped mesa structure in a semiconductor laser portion are buried in a semi-insulating semiconductor. On the other hand, both side surfaces of the stripe-shaped mesa structure in an optical modulator portion are buried in a resin (polymer), such as benzocyclobutene (BCB).

FIGS. 24, 25A, and 25B illustrate an example of a semiconductor optical integrated device having a structure in which stripe-shaped mesa structures located in a semiconductor laser portion and an optical modulator potion are buried in different buried layers. FIG. 24 is a plan view of a'semiconductor optical integrated device 100. FIG. 25A is a cross-sectional view taken along line XV-XV in FIG. 24 and indicates a cross section of a semiconductor laser portion 120 of the semiconductor optical integrated device 100, the cross section being normal to a light propagation direction in the semiconductor laser portion 120. FIG. 25B is a cross-sectional view taken along line XVI-XVI in FIG. 24 and indicates a cross section of an optical modulator portion 140 of the semiconductor optical integrated device 100, the cross section being normal to a light propagation direction in the optical modulator portion 140.

As illustrated in FIGS. 24, 25A, and 25B, the semiconductor optical integrated device 100 includes an n-type semiconductor substrate 110; and the semiconductor laser portion 120 and the optical modulator portion 140 on a main surface 110a of the n-type semiconductor substrate 110, the semiconductor laser portion 120 and the optical modulator portion 140 being arranged in a predetermined light propagation direction.

As illustrated in FIG. 25A, the semiconductor laser portion 120 has a stripe-shaped mesa structure 121 extending in the light propagation direction described above. The stripe-shaped mesa structure 121 includes an n-type semiconductor layer (lower cladding layer) 122, an active layer (core layer) 123, and a p-type semiconductor layer (upper cladding layer) 124 stacked, in that order, on the main surface 110a. Both side surfaces 121a and 121b of the stripe-shaped mesa structure 121 are buried in semiconductor-buried portions 125 and 126 composed of a semi-insulating semiconductor. Surfaces of the semiconductor-buried portions 125 and 126 are covered with an insulating layer 127. A resin region 130 is arranged along side surfaces of the semiconductor-buried portions 125 and 126 opposite the side surfaces adjacent to the stripe-shaped mesa structure 121. A surface of the semiconductor laser portion 120 is planarized with the resin region 130. An opening is arranged in the insulating layer 127 so as to be located on the stripe-shaped mesa structure 121. An anode electrode 128 is in contact with the p-type semiconductor layer 124 through the opening. A lead line 129a extending from the anode electrode 128 is arranged on the resin region 130. A metal pad 129b is arranged on the resin region 130 and electrically connected to the lead line 129a. A cathode electrode 131 is formed on the back surface 110b of the n-type semiconductor substrate 110.

As illustrated in FIG. 25B, the optical modulator portion 140 has a stripe-shaped mesa structure 141 extending in the light propagation direction described above. The stripe-shaped mesa structure 141 includes an n-type semiconductor layer (lower cladding layer) 142, a light absorbing layer (core layer) 143, and a p-type semiconductor layer (upper cladding layer) 144 stacked, in that order, on the main surface 110a. The stripe-shaped mesa structure 141 is formed by forming a pair of grooves 152 and 153 extending in the light propagation direction. The pair of grooves 152 and 153 is formed by etching the stacked semiconductor layers of the n-type semiconductor layer 142, the light absorbing layer 143, and the p-type semiconductor layer 144 so as to define the stripe-shaped mesa structure 141. Protective films 147 are arranged on inner surfaces of the grooves 152 and 153. The protective films 147 are arranged over p-type semiconductor layers 144 located outside the grooves 152 and 153. The grooves 152 and 153 are filled with the resin region 130. The resin region 130 is arranged over the protective films 147 located outside the grooves 152 and 153. An opening passing through the resin region 130 and the protective films 147 is arranged on the stripe-shaped mesa structure 141. An anode electrode 148 is in contact with the p-type semiconductor layer 144 of the stripe-shaped mesa structure 141 through the opening. A lead line 149a extending from the anode electrode 148 is arranged on the resin region 130. A metal pad 149b is arranged on the resin region 130 and electrically connected to the lead line 149a. The cathode electrode 131. common to the semiconductor laser portion 120 is formed on the back surface 110b of the n-type semiconductor substrate 110.

For fabricating the semiconductor optical integrated device 100 illustrated in FIGS. 24, 25A, and 25B, the n-type semiconductor layer 122, the active layer 123, and the p-type semiconductor layer 124 are formed, in that order, on the main surface 110a of the n-type semiconductor substrate 110 by crystal growth. Next, a mask that covers a region to be formed into the semiconductor laser portion 120 is formed on the p-type semiconductor layer 124. Portions of the n-type semiconductor layer 122, the active layer 123, and the p-type semiconductor layer 124 that are not covered with the mask are removed by etching with the mask. The n-type semiconductor layer 142, the light absorbing layer 143, and the p-type semiconductor layer 144 are formed by crystal growth on the main surface 110a exposed by the foregoing etching, while leaving the mask. At this time, an end surface of the light absorbing layer 143 is directly bonded to an end surface of the active layer 123 by the butt-joint method.

A mask Ma having a planar shape as illustrated in FIG. 26 is formed on the p-type semiconductor layer 124 and the p-type semiconductor layer 144. The mask Ma includes pattern $Ma_1$ extending in light propagation direction A1 (that is, a waveguiding direction) and a pair of patterns $Ma_2$. The patterns $Ma_2$ are located on both sides of a portion of the pattern $Ma_1$ arranged on the p-type semiconductor layer 144. The patterns $Ma_2$ include side edges $Ma_{21}$ facing the pattern $Ma_1$; and end edges $Ma_{22}$ extending in a direction intersecting the light propagation direction A1. The semiconductor layers are etched with the mask Ma having the shape, thereby forming the stripe-shaped mesa structure 121 and the pair of grooves 152 and 153 used to form the, stripe-shaped mesa structure 141.

A mask covering the stripe-shaped mesa structure 141 and the pair of grooves 152 and 153 is formed. The semiconductor-buried portions 125 and 126 are selectively grown on both side surfaces 121a and 1121b of the stripe shaped mesa structure 121 with the mask. Here, FIGS. 27 to 30B illustrate states of a mask Mb and the semiconductor-buried portions 125 and 126 after this step. FIG. 27 is a plan view illustrating the mask Mb and the semiconductor-buried portions 125 and 126. FIG. 28 is a cross-sectional view taken along line XVII-XVII in FIG. 27. FIG. 29A is a cross-sectional view taken along line XVIII-XVIII in FIG. 27. FIG. 29B is a cross-sectional view taken along line XIX-XIX in FIG. 27. FIG. 30A is a cross-sectional view taken along line XX-XX in FIG. 27. FIG. 30B is a cross-sectional view taken along line XXI-XXI in FIG. 27.

As illustrated in FIG. 27, in this example, an end edge $Mb_1$ of the mask Mb in the light propagation direction A1 is located on the side of the semiconductor laser portion 120 (upper side of the figure) with respect to positions of end surfaces 145 of the n-type semiconductor layer 142, the light absorbing layer 143, and the p-type semiconductor layer 144 in the light propagation direction A1 (i.e., positions of the end edges $Ma_{22}$ of the patterns $Ma_2$ illustrated in FIG. 26). When the mask Mb is formed in this way, the mask Mb covers the end surfaces 145 and its vicinity illustrated in FIG. 28. As a result, gaps B are formed between the semiconductor-buried portions 125 and 126 and the end surfaces 145. Furthermore, when the resin region 130 is formed over the semiconductor-buried portions 125 and 126 and the p-type semiconductor layer 144 by coating, a resin material does not easily enter the gaps B. This may cause the degradation of the surface flatness of the resin region 130.

According to an aspect of the present invention, a method for producing a semiconductor optical integrated device includes the steps of forming a substrate product including a first stacked semiconductor layer portion and a second stacked semiconductor layer portion that are arranged in a predetermined direction; forming a first mask on the first and second stacked semiconductor layer portions, the first mask including a first pattern region and a second pattern region, the first pattern region having a stripe shape that extends in the predetermined direction, the second pattern region including a first side edge and a first end edge, the first side edge facing a portion of the first pattern region arranged on the second stacked semiconductor layer portion, and the first end edge extending in a direction crossing the predetermined direction; forming a stripe-shaped mesa structure by etching the first and second stacked semiconductor layer portions with the first mask; removing the second pattern region of the first mask to expose a surface of the second stacked semiconductor layer portion; forming a second mask on the second stacked semiconductor layer potion, the second mask covering the upper portion and both side surfaces of the stripe-shaped mesa structure in the second stacked semiconductor layer portion; selectively growing a buried semiconductor layer on both side surfaces of the stripe-shaped mesa structure in the first stacked semiconductor layer portion with the first and second masks; and forming a resin region on both side surfaces of the stripe-shaped mesa structure in the second stacked semiconductor layer portion. In addition, the second mask includes a second end edge separated from the first end edge of the first mask, the second end edge being located on the side of the second stacked semiconductor layer portion in the predetermined direction with respect to the first end edge of the first mask.

In the method for producing a semiconductor optical integrated device according to the aspect, preferably, in the step of forming the stripe-shaped mesa structure, a terrace-like portion corresponding to the second pattern region of the first mask is formed, and a pair of grooves extending in the predetermined direction is formed, the pair of grooves being arranged between the stripe-shaped mesa structure and the terrace-like portion. In addition, in the step of selectively growing the buried semiconductor layer, an end surface of the terrace-like portion extending in a direction crossing the predetermined direction and part of the pair of grooves are buried by the buried semiconductor layer.

In this production method, the first mask used in the step of forming the stripe-shaped mesa structure includes the first pattern region and the second pattern region, the first pattern extending in the predetermined direction, the second pattern region including the first side edge and the first end edge, the first side edge facing the portion of the first pattern region arranged on the second stacked semiconductor layer portion, and the first end edge extending in a direction crossing the predetermined direction (for example, see a pattern $Ma_2$ illustrated in FIG. 26). The second mask used as a selective mask in the step of selectively growing a buried semiconductor layer includes the second end edge separated from the first end edge of the first mask. The second end edge is located on the side of the second stacked semiconductor layer portion in the predetermined direction with respect to the end edge of the first mask. The second mask does not cover end surfaces of the stacked semiconductor layer portions (for example, end surfaces 145 illustrated in FIG. 27) and their vicinities formed by the first end edge of the first mask. Thus, the buried semiconductor layer is grown on the end surfaces, so that so that the gaps B as illustrated in FIG. 27 are not formed between the end surfaces and the buried semiconductor layer. According to the production method described above, it is thus possible to enhance the surface flatness of a resin region when both side surfaces of the stripe-shaped mesa structure in the second stacked semiconductor layer portion are buried by the resin region in the step of forming the resin region.

In the method for producing a semiconductor optical integrated device according to the aspect, the second mask may further include a second side edge on the second stacked semiconductor layer portion, the second side edge extending in the predetermined direction, and the second side edge defines the width of the second mask in a direction crossing the predetermined direction. When the buried semiconductor layer is selectively grown, a by-product from a semiconductor material is formed on the mask. The use of a mask having a large area that covers the whole of the second stacked semiconductor layer portion increases the amount of the by-product on the mask, hereby affecting the growth of the buried semiconductor layer. In contrast, the second mask includes the second side edge extending in the predetermined direction (that is, the second mask is formed so as to be limited to the vicinity of the stripe-shaped mesa structure in the second stacked semiconductor layer portion), thereby reducing the amount of the by-product as described above and suitably growing the buried semiconductor layer. In addition, the second side edge defines the width of the second mask in a direction crossing the predetermined direction.

In the method for producing a semiconductor optical integrated device according to the aspect, the second mask is preferably composed of a dielectric material different from a material constituting the first mask. Furthermore, the second mask is preferably formed by an etching process, the etch rate of the second mask being higher than the etch rate of the first mask. In this case, when the second mask is formed, it is possible to inhibit ah excessive reduction in the thickness of the first mask due the etching of the material constituting the first mask. As a result, a state in which the first mask is arranged can be maintained on the stripe-shaped mesa structure in the subsequent step of selectively growing a buried semiconductor layer. It is thus possible to suitably prevent the growth of a semiconductor layer on the stripe-shaped mesa structure.

In the method for producing a semiconductor optical integrated device according to the aspect, the first mask may be composed of $SiO_2$, and the second mask may be composed of SiN. The etching process may be performed by wet etching with hydrofluoric acid.

In the method for producing a semiconductor optical integrated device according to the aspect, the buried semiconductor layer may be composed of Fe-doped InP, and in the step of selectively growing the buried semiconductor layer, the buried semiconductor layer is grown with supplying 1,2-dichlotoethane. In this case, it is possible to suitably grow the buried semiconductor layer on both side surfaces of the stripe-shaped mesa structure in the first stacked semiconductor layer portion and on the end surfaces of the stacked semiconductor layer portions formed by the first end edge of the first mask.

In the method for producing a semiconductor optical integrated device according to the aspect, the resin region may be composed of a benzocyclobutene resin or a polyimide resin.

The method for producing a semiconductor optical integrated device according to the aspect preferably further includes the steps of alter selectively growing the buried semiconductor layer, removing the first mask and the second mask, and then forming a protective film on a surface of the substrate product; after forming the resin region, etching the resin region to expose the protective film on the stripe-shaped mesa structure; forming an opening in the protective film on the stripe-shaped mesa structure by etching the protective film using the resin region as a mask; and forming an electrode in the opening.

In the method for producing a semiconductor optical integrated device according to the aspect, the first stacked semiconductor layer portion may have a first optical waveguide layer, and the second stacked semiconductor layer portion may have a second optical waveguide layer optically connected to the first optical waveguide layer.

In the method for producing a semiconductor optical integrated device according to the aspect, the substrate product preferably includes a third stacked semiconductor layer portion located between the first and second stacked semiconductor layer portions. The first pattern region of the first mask is formed on the first, second and third stacked semiconductor layer portions of the substrate product, the second pattern region of the first mask is formed on the second stacked semiconductor layer portion and partially formed on the third stacked semiconductor layer portion. The first end edge of the first mask is located on the third stacked semiconductor layer portion. In addition, the second end edge of the second mask is located on the side of the second stacked semiconductor layer portion in the predetermined direction with respect to the first end edge of the first mask. In addition, the third stacked semiconductor layer portion may have a third optical waveguide layer. The first, second and third optical waveguide layers may be optically connected to each other.

BRIEF DESCRIPTION OF THE DRAWINGS

FIGS. 7A and 7B are perspective views illustrating steps of a production method according to an embodiment.

FIGS. 8A and 8B are perspective views illustrating steps of a production method according to an embodiment.

FIGS. 9A and 9B are perspective views illustrating steps of a production method according to an embodiment.

FIGS. 10A and 10B are perspective views illustrating steps of a production method according to an embodiment.

FIGS. 11A and 11B are perspective views illustrating mesa formation steps of a production method according to an embodiment.

FIGS. 12A and 12B are perspective views illustrating steps of a production method according to an embodiment.

FIGS. 14A and 14B are perspective views illustrating steps of a production method according to an embodiment.

FIGS. 17A and 17B are perspective views illustrating steps of a production method according to an embodiment.

FIG. 28 is a cross-sectional view taken along line XVII-XVII in FIG. 27.

FIGS. 30A and 30B are cross-sectional views taken along lines XX-XX and XXI-XXI, respectively, in FIG. 27.

DESCRIPTION OF THE PREFERRED EMBODIMENTS

Figure 1:
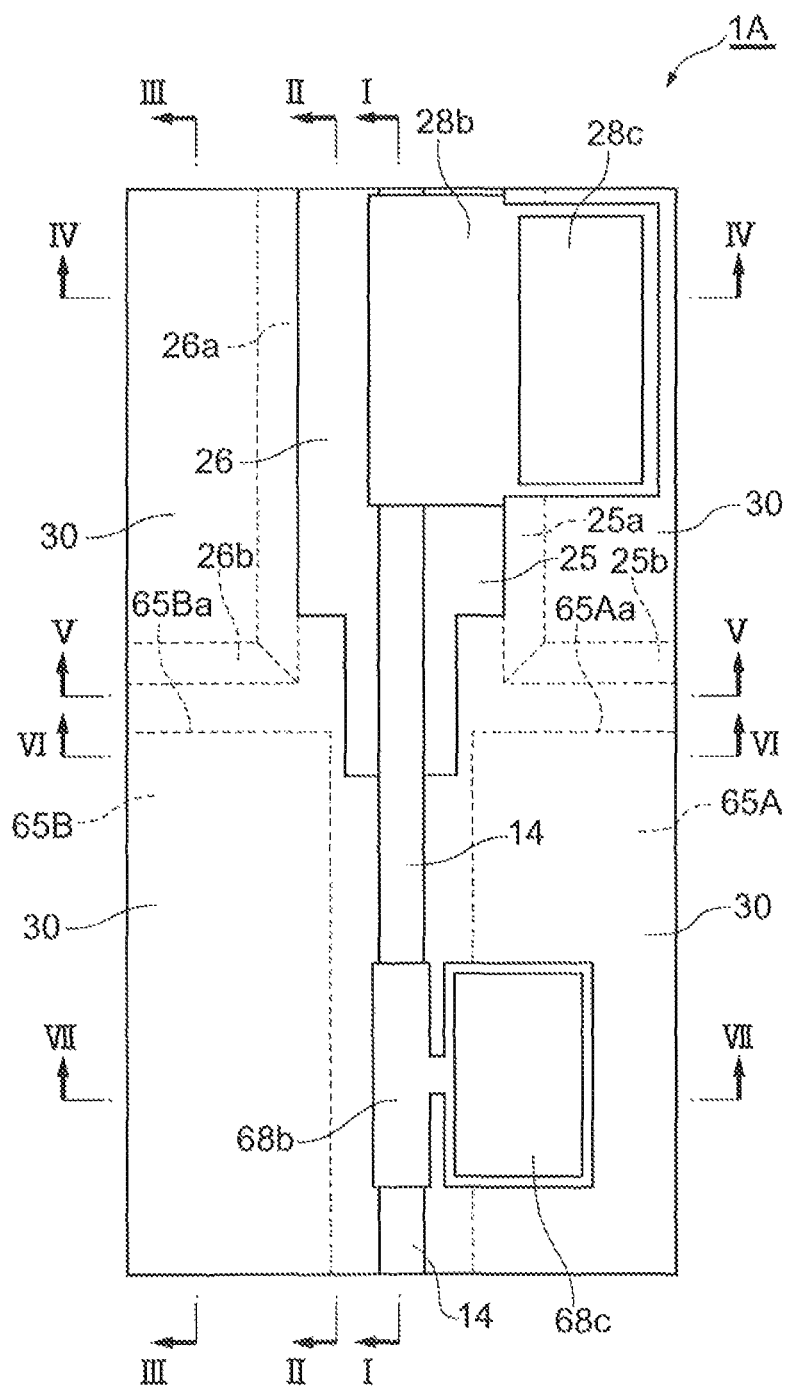
FIG. 1 is a plan view illustrating the structure of a semiconductor optical integrated device produced by a production method according to an embodiment of the present invention.

Embodiments of a method for producing a semiconductor optical integrated device will be described in detail below with reference to the attached drawings. In the drawings, the same elements are designated using the same reference numerals, and redundant description is not repeated.

Figure 2:
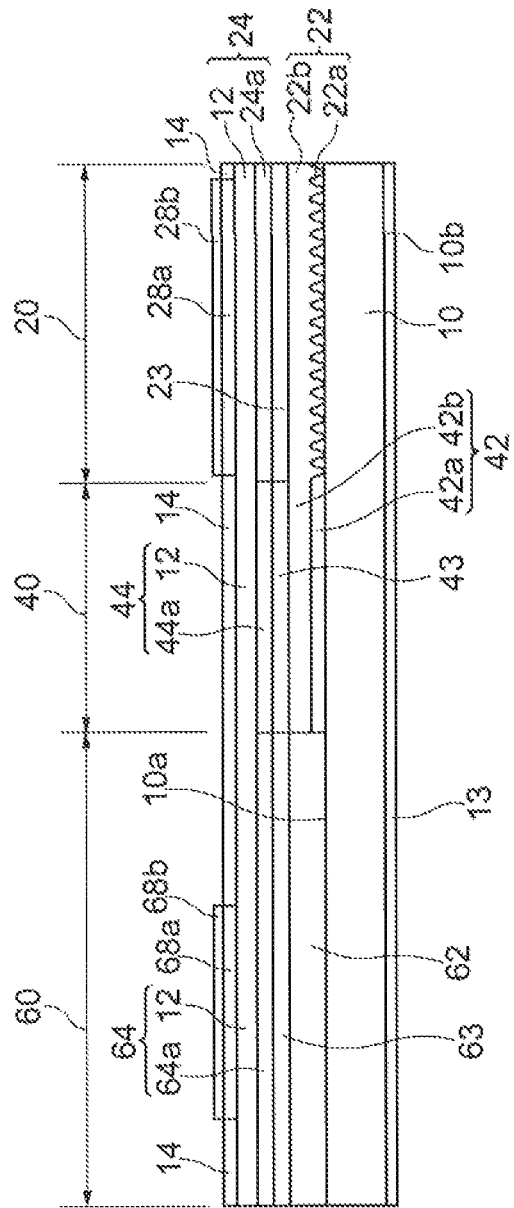
FIG. 2 is a cross-sectional view of the semiconductor optical integrated device taken along line I-I in FIG. 1 and illustrates a cross section in a light propagation direction.
Figure 3:
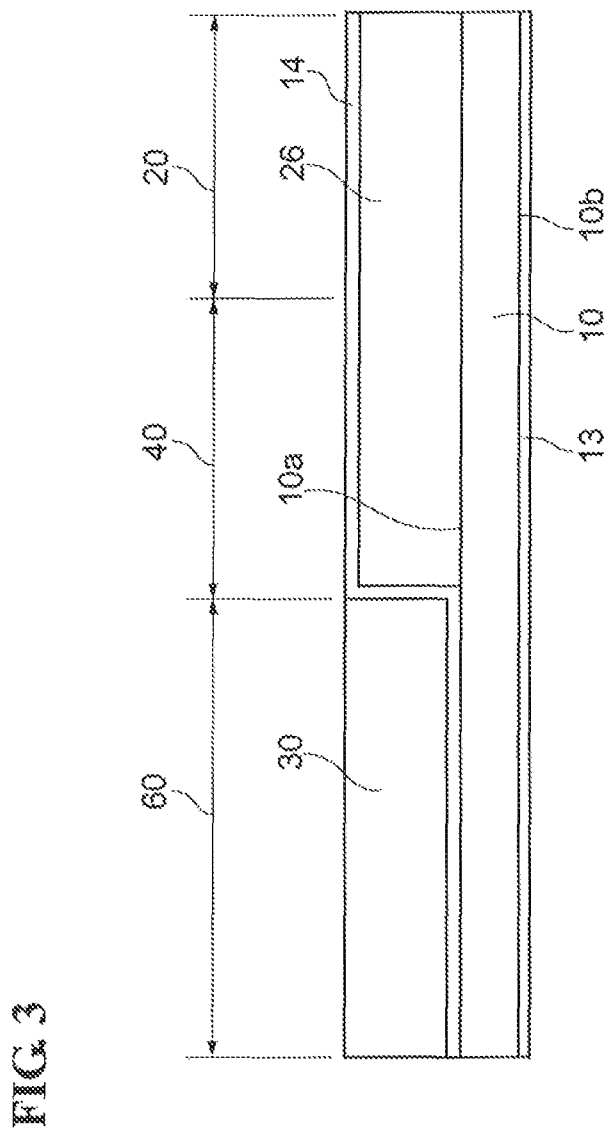
FIG. 3 is a cross-sectional view of the semiconductor optical integrated device taken along line II-II in FIG. 1 and illustrates a cross section in the light propagation direction.
Figure 4:
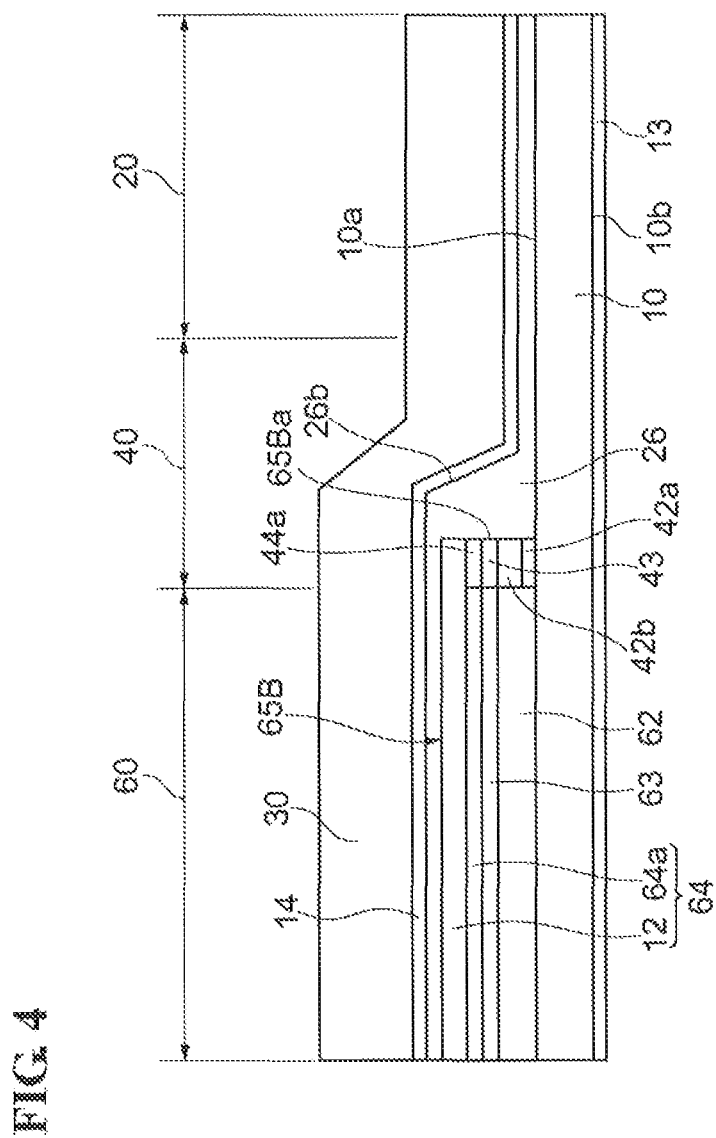
FIG. 4 is a cross-sectional view of the semiconductor optical integrated device taken along line III-III in FIG. 1 and illustrates a cross section in the light propagation direction.

FIGS. 1 to 6B illustrate structures of a semiconductor optical integrated device 1A according to an embodiment of the present invention. FIG. 1 is a plan view of the semiconductor optical integrated device 1A. FIGS. 2, 3, and 4 are cross-sectional views of the semiconductor optical integrated device 1A taken along lines I-I, II-II, and III-III, respectively, in FIG. 1. FIGS. 2 to 4 illustrate cross sections in a light propagation direction. FIGS. 5A, 5B, 6A, and 6B are cross-sectional views of the semiconductor optical integrated device 1A taken along lines IV-IV, V-V, VI-VI, and VII-VII, respectively, in FIG. 1. FIGS. 5A, 5B, 6A, and 6B illustrate cross sections perpendicular to the light propagation direction.

As illustrated in FIGS. 1 and 2, the semiconductor optical integrated device 1A according to this embodiment includes an n-type semiconductor substrate 10. The n-type semiconductor substrate 10 is composed of an n-type III-V group compound semiconductor. For example, the n-type semiconductor substrate 10 is composed of a Si-doped n-type InP. Furthermore, a main surface 10a includes, for example, a (100) crystal orientation and a vicinity of the (100) crystal orientation tilted from the (100) plane. The semiconductor optical integrated device 1A further includes a semiconductor laser portion 20, a waveguide portion 40, and an optical modulator portion 60 arranged in this order in the predetermined light propagation direction on the main surface 10a of the n-type semiconductor substrate 10. The waveguide portion 40 connects the semiconductor laser portion 20 to the optical modulator portion.

Figure 5A:
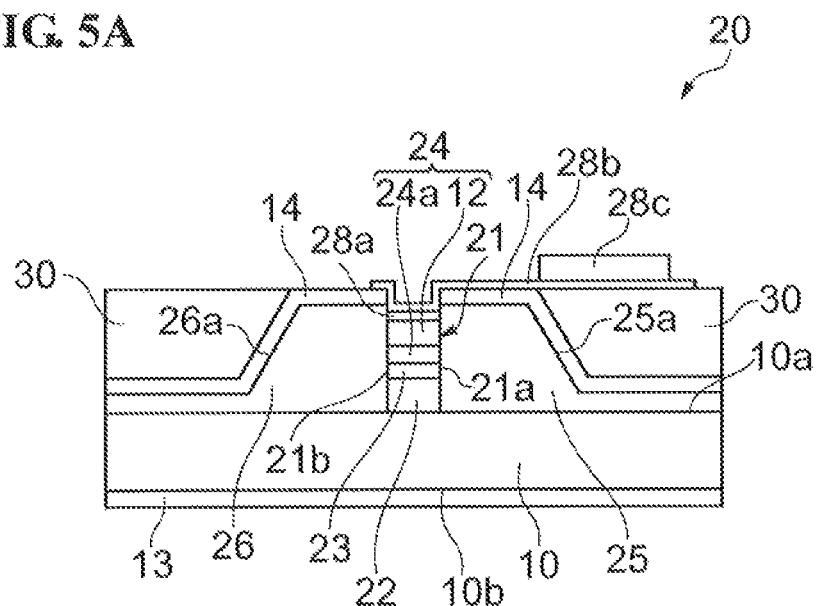
FIGS. 5A and 5B are cross-sectional views of the semiconductor optical integrated device taken along lines IV-IV and V-V, respectively, in FIG. 1 and illustrate cross sections perpendicular to the light propagation direction.

As illustrated in FIG. 5A, the semiconductor laser portion 20 has a stripe-shaped mesa structure 21 extending in a light propagation direction (that is, a waveguiding direction). The stripe-shaped mesa structure 21 includes an n-type buffer layer (not illustrated), an n-type semiconductor region, 22, a core layer 23, and a p-type semiconductor region 24 stacked, in that order, on the main surface 10a. The stripe-shaped mesa structure 21 has a height of, for example, 3.0 µm to 4.0 µm.

The n-type semiconductor region 22 includes a diffraction grating layer 22a having a diffraction grating (see FIG. 2) with a predetermined period in the light propagation direction, the diffraction grating of the diffraction grating layer 22a being buried in an n-type semiconductor layer 22b. The diffraction grating layer 22a and the n-type semiconductor layer 22b are each composed of a III-V group compound semiconductor. Specifically, the diffraction grating layer 22a is composed of, for example, Si-doped n-type InGaAsP. The n-type semiconductor layer 22b is composed of, for example, Si-doped n-type InP. The diffraction grating layer 22a has a thickness of, for example, 70 nm. The n-type semiconductor layer 22b has a thickness of, for example, 120 nm.

The core layer 23 includes a lower optical confinement layer, an upper optical confinement layer, and an active layer provided between these optical confinement layers. These layers are composed of, for example, undoped InGaAsp having different compositions. Each of the lower and upper optical confinement layers has a thickness of, for example, 50 nm. The active layer has a multi-quantum well (MQW) structure in which, for example, a plurality of well layers and a plurality of barrier layers are alternately stacked.

The p-type semiconductor region 24 includes a p-type semiconductor layer 24a and a p-type semiconductor layer 12 arranged on the p-type semiconductor layer 24a. The p-type semiconductor layer 24a is composed of, for example, Zn-doped p-type InP. The p-type semiconductor layer 24a is arranged only in the semiconductor laser portion 20 and functions as a cladding for the core layer 23. As illustrated in FIG. 2, the p-type semiconductor layer 12 is arranged as a layer common to the semiconductor laser portion 20, the waveguide portion 40, and the optical modulator portion 60. The p-type semiconductor layer 12 includes, for example, a cladding layer composed of Zn-doped p-type InP, an intermediate layer composed of Zn-doped p-type InGaAsP, and a contact layer composed of Zn-doped p-type InGaAs.

Both side surfaces 21a and 21b of the stripe-shaped mesa structure 21 are buried by semiconductor-buried portions 25 and 26. The semiconductor-buried portions 25 and 26 are composed of a semi-insulating semiconductor, such as Fe-doped InP. The semiconductor-buried portions 25 and 26 have side surfaces 25a and 26a opposite the side surfaces in contact with the side surfaces 21a and 21b. The side surfaces 25a and 26a are tilted with respect to both of the main surface 10a and the side surfaces 21a and 21b. Surfaces (upper surfaces and the side surfaces 25a and 26a) of the semiconductor-buried portions 25 and 26 are covered with a protective film 14. The protective film 14 is composed of a dielectric film, such as $SiO_2$, SiON, or SiN.

A resin region 30 is arranged along the side surfaces 25a and 26a of the semiconductor-buried portions 25 and 26 on the main surface 10a of the n-type semiconductor substrate 10. A surface of the semiconductor laser portion 20 is planarized with the resin region 30. The resin region 30 is composed of, for example, a benzocyclobutene (BCB) resin or a polyimide resin. As illustrated in FIG. 4, the resin region 30 is arranged as a resin region common to the semiconductor laser portion 20, the waveguide portion 40, and the optical modulator portion 60.

An opening is arranged in the protective film 14 on the stripe-shaped mesa structure 21. In the opening, an ohmic metal film 28a is formed. The ohmic metal film 28a is overlaid with a metal film 28b for a wiring electrode. The metal film 28b for a wiring electrode is arranged so as to extend from the stripe-shaped mesa structure 21 to the resin region 30. A wire bonding pad 28c is arranged on the metal film 28b for a wiring electrode on the resin region 30. The wire bonding pad 28c is electrically connected to the metal film 28b for a wiring electrode. The ohmic metal film 28a is composed of, for example, AuZn/Au. The metal film 28b for a wiring electrode includes a metal layer composed of, for example, Ti/Pt/Au or TiW/Pt/Au; and an Au layer formed by plating on the metal layer. When the metal film 28b for a wiring electrode is composed of, for example, Ti/Pt/Au, the wire bonding pad 28c is formed by Au plating. When the metal film 28b for a wiring electrode is composed of TiW/Pt/Au, the wire bonding pad 28c is integrated with the Au layer of the metal film 28b for a wiring electrode. An ohmic metal film 13 is formed on a back surface 10b of the n-type semiconductor substrate 10. The ohmic metal film 13 is composed of, for example, AuGe/Au or AuGe/Ti/Pt/Au. As illustrated in FIG. 2, the ohmic metal film 13 is arranged as an ohmic metal film common to the semiconductor laser portion 20 and the optical modulator portion 60.

Figure 6A:
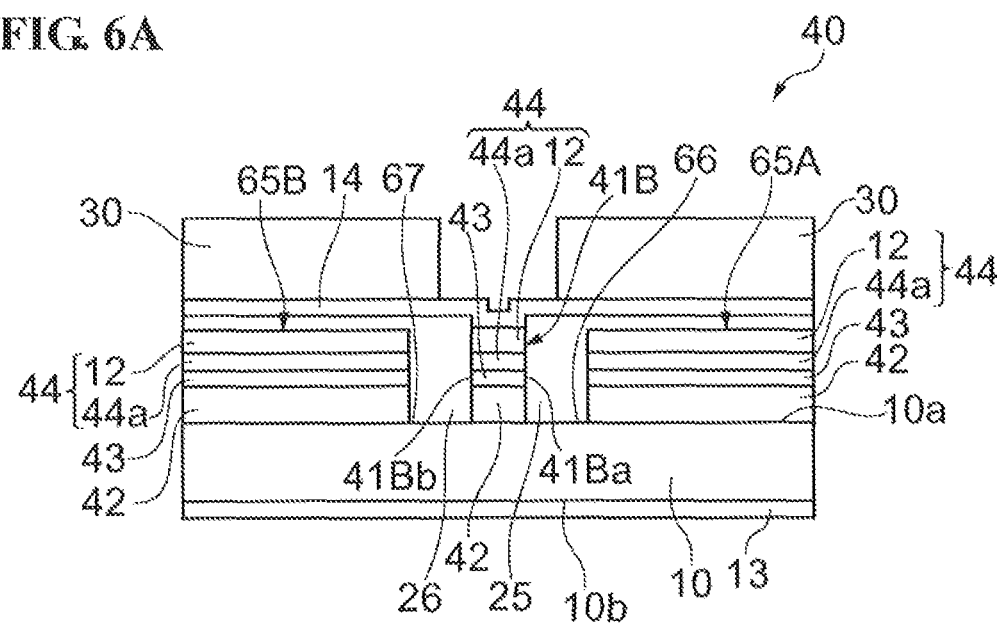
FIGS. 6A and 6B are cross-sectional views of the semiconductor optical integrated device taken along lines VI-VI and VII-VII, respectively, in FIG. 1 and illustrate cross sections perpendicular to the light propagation direction.
Figure 6B:
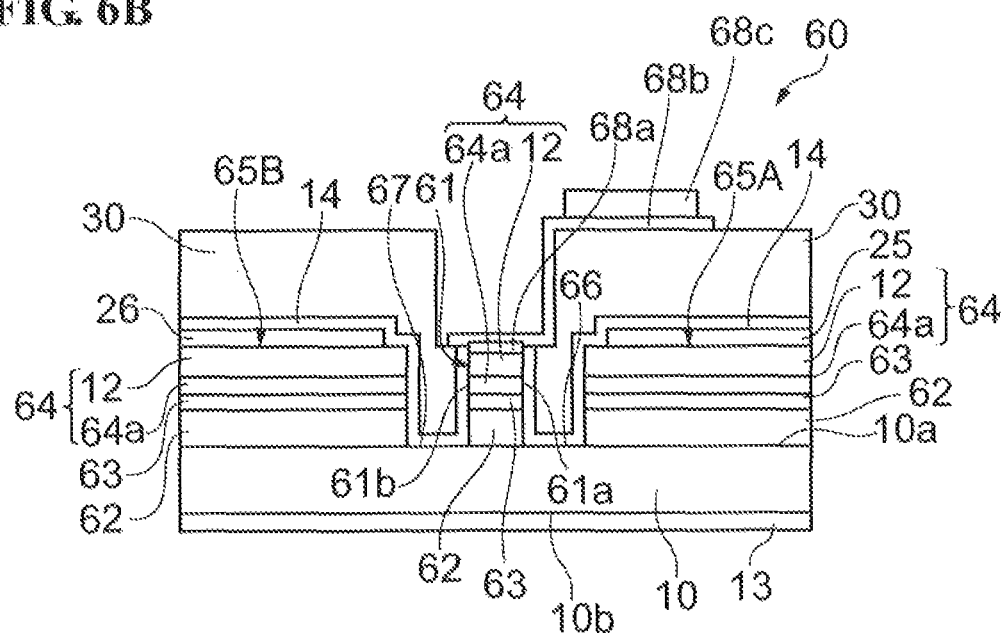

As illustrated in FIG. 6B, the optical modulator portion 60 includes an n-type buffer layer (not illustrated), an n-type semiconductor region 62, a core layer 63, and a p-type semiconductor region 64 stacked, in that order, on the main surface 10a. A pair of grooves 66 and 67 extending in a light propagation direction (that is, a waveguiding direction) is arranged in the n-type semiconductor region 62, the core layer 63, and the p-type semiconductor region 64. A region sandwiched by these grooves 66 and 67 has a stripe-shaped mesa structure 61 extending in the light propagation direction. The height of the stripe-shaped mesa structure 61 (in other words, the depth of the pair of grooves 66 and 67) is in the range of, for example, 3.0 µm to 4.0 µm.

The n-type semiconductor region 62 is composed of, for example, Si-doped n-type InP. The n-type semiconductor region 62 functions as a cladding for the core layer 63. The n-type semiconductor region 62 has a thickness of, for example, 200 nm. The core layer 63 includes a light absorbing layer. The light absorbing layer is formed of, for example, a single undoped AlGaInAs layer. Alternatively, the light absorbing layer has, for example, a multi-quantum well (MQW) structure in which a plurality of well layers composed of AlGaInAs and a plurality of barrier layers are alternately stacked. The p-type semiconductor region 64 includes a p-type semiconductor layer 64a and the p-type semiconductor layer 12 on the p-type semiconductor layer 64a. The p-type semiconductor layer 64a, is composed of, for example, Zn-doped p-type InP.

The protective film 14 is arranged on inner surfaces of the pair of grooves 66 and 67 (including both side surfaces of the stripe-shaped mesa structure 61) and on the p-type semiconductor region 64 located outside the pair of grooves 66 and 67. The resin region 30 is arranged on the protective film 14. The pair of grooves 66 and 67 is buried by the resin region 30. As a result, both side surfaces of the stripe-shaped mesa structure 61 are buried by the resin region 30.

An opening passing through the resin region 30 and the protective film 14 is arranged on the stripe-shaped mesa structure 61. In the opening, an ohmic metal film 68a is formed. A metal film 68b for a wiring electrode is arranged on the ohmic metal film 68a. The metal film 68b for a wiring electrode is arranged so as to extend from the stripe-shaped mesa structure 61 to the resin region 30. A wire bonding pad 68c is arranged on the metal film 68b for a wiring electrode on the resin region 30. The ohmic metal film 68a is composed of, for example, AuZn/Au. The metal film 68b for a wiring electrode includes a metal layer composed of, for example, Ti/Pt/Au or TiW/Pt/Au; and an Au layer formed by plating on the metal layer. When the metal film 68b for a wiring electrode is composed of, for example, Ti/Pt/Au, the wire bonding pad 68c is formed of a Au layer formed by plating. When the metal film 68b for a wiring electrode is composed of TiW/Pt/Au, the wire bonding pad 68c is integrated with the Au layer of the metal film 68b for a wiring electrode. The ohmic metal film 13 is formed on the back surface 10b of the n-type semiconductor substrate 10.

Figure 5B:
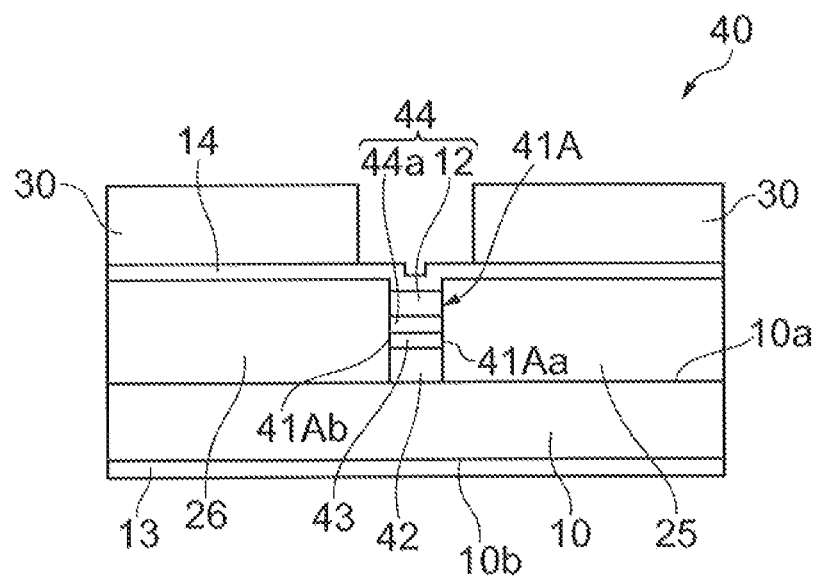

As illustrated in FIGS. 5B and 6A, the waveguide portion 40 includes stripe-shaped mesa structures 41A and 41B which are continuously arranged in the light propagation direction (that is, the waveguiding direction). The stripe-shaped mesa structures 41A and 41B also extend in the light propagation direction. The stripe-shaped mesa structure 41A is arranged on the side of the semiconductor laser portion 20. The stripe-shaped mesa structure 41B is arranged on the side of the optical modulator portion 60. These stripe-shaped mesa structures 41A and 41B include an n-type buffer layer (not illustrated), an n-type semiconductor region 42, a core layer 43, and a p-type semiconductor region 44 stacked, in that order, on the main surface 10a. The stripe-shaped mesa structure 41B is formed by farming the pair of grooves 66 and 67 in the n-type semiconductor region 42, the core layer 43, and the p-type semiconductor region 44. Here, the pair of grooves 66 and 67 extends from the optical modulator portion 60.

The n-type semiconductor region 42 includes n-type semiconductor layers 42a and 42b. The constituent material and the thickness of the n-type semiconductor layer 42a are the same as those of the diffraction grating layer 22a in the semiconductor laser portion 20. However, the n-type semiconductor layer 42a does not include a diffraction grating. The constituent material and the thickness of the n-type semiconductor layer 42b are the same as those of the n-type semiconductor layer 22b in the semiconductor laser portion 20. The n-type semiconductor layer 42b functions as a cladding for the core layer 43. The core layer 43 is formed of, for example, a single undoped InGaAsP layer. The p-type semiconductor region 44 includes a p-type semiconductor layer 44a and the p-type semiconductor layer 12 on the p-type semiconductor layer 44a. The p-type semiconductor layer 44a is composed of a p-type III-V group compound semiconductor, such as Zn-doped InP.

In the waveguide portion 40, there is a difference in surrounding structure between the stripe-shaped mesa structure 41A arranged on the side of the semiconductor laser portion 20 and the stripe-shaped mesa structure 41B arranged on the side of the optical modulator portion 60. Side surfaces 41Aa and 41Ab of the stripe-shaped mesa structure 41A and side surfaces 41Ba and 41Bb of the stripe-shaped mesa structure 41B are buried by semiconductor-buried portions 25 and 26 each composed of a semi-insulating semiconductor such as Fe-doped InP. The semiconductor-buried portions 25 and 26 are common to those in the semiconductor laser portion 20. However, the side surfaces 41Ba and 41Bb of the stripe-shaped mesa structure 41B are formed of the pair of grooves 66 and 67 extending from the optical modulator portion 60. Thus, the pair of grooves 66 and 67 is filled with the semiconductor-buried portions 25 and 26. Meanwhile, the semiconductor-buried portions 25 and 26 in which the side surfaces 41Aa and 41Ab of the stripe-shaped mesa structure 41A are buried extend widely to regions remote from the stripe-shaped mesa structure 41A.

As described above, in the optical modulator portion 60, the stripe-shaped mesa structure 61 is formed of the pair of grooves 66 and 67. That is, terrace-like portions 65A and 65B (see FIG. 6B) including the n-type semiconductor region 62, the core layer 63, and the p-type semiconductor region 64 are left outside the pair of grooves 66 and 67 (opposite side of the stripe-shaped mesa structure 61). In contrast, such a terrace-like portion is not present in the semiconductor laser portion 20. Thus, end surfaces 65Aa and 65Ba of the terrace-like portions 65A and 65B are arranged between the semiconductor laser portion 20 and the optical modulator portion 60, as illustrated in FIGS. 1 and 4. In this embodiment, the end surfaces 65Aa and 65Ba are arranged in the waveguide portion 40.

When the semiconductor-buried portions 25 and 26 are formed, the semiconductor-buried portions 25 and 26 are grown not only on the side surfaces 21a and 21b of the stripe-shaped mesa structure 21 but also on the end surfaces 65Aa and 65Ba. As a result, the semiconductor-buried portions 25 and 26 in which the side surfaces 41Aa and 41Ab of the stripe-shaped mesa structure 41A are buried extend widely to the regions remote from the stripe-shaped mesa structure 41A, as described above. As illustrated in FIGS. 1 and 4, the semiconductor-buried portions 25 and 26 grown on the end surfaces 65Aa and 65Ba include inclined surfaces 25b and 26b, respectively, extending in a direction crossing the light propagation direction.

Also in the waveguide portion 40, the surfaces of the semiconductor-buried portions 25 and 26 are covered with the protective film 14. The resin region 30 is arranged on the protective film 14. In the waveguide portion 40, an electrode (ohmic metal film) is not arranged, so an opening is not arranged in the protective film 14.

A method for producing the semiconductor optical integrated device 1A having the foregoing structure will be described below. FIGS. 7A to 17B are perspective views illustrating steps of the production method according to this embodiment. In the production method described below, the semiconductor layers are grown by, for example, a metal-organic vapor phase epitaxy (MOVPE) method.

As illustrated in FIG. 7A, a stacked semiconductor layer portion 32 used to form the semiconductor laser portion 20 is formed on the main surface 10a of the n-type semiconductor substrate 10. The stacked semiconductor layer portion 32 is a first stacked semiconductor layer portion in this embodiment. Specifically, an InP buffer layer, an InGaAsP diffraction grating layer, and an InP capping layer are grown on the main surface 10a. The InP buffer layer has a thickness of, for example, 500 nm. The InGaAsP diffraction grating layer has a thickness of, for example, 70 nm. The InP capping layer has a thickness of, for example, 20 nm. A SiN film is formed by, for example, a chemical vapor deposition (CVD) method on the InP capping layer. A resist is then applied on the SiN film. A diffraction grating pattern is formed by an interference exposure method in the resist on a region to be formed into the semiconductor laser portion 20. The SiN film is etched by inductively coupled plasma reactive ion etching (ICP-RIE) with a $CF_4$-based gas using the resist as a mask. The etching is performed until the SiN film is penetrated. Then the gas used in the ICP-CVD is switched to $O_2$ to remove the resist by ashing. In this way, the diffraction grating pattern is transferred to the SiN film. The InGaAsP diffraction grating layer is etched with the SiN film as an etching mask. In this case, for example, ICP-RIE with a $CH_4/H_2$-based gas is preferably employed as an etching process. The etch depth is preferred to the extent that, for example, the InGaAsP diffraction grating layer is penetrated to expose the InP buffer layer. In this way, the diffraction grating layer 22a having a diffraction grating with a predetermined period in the light propagation direction is formed. Next, the SiN film is removed with hydrofluoric acid. Furthermore, a surface of the diffraction grating layer 22a is etched with a mixed solution of sulfuric acid and an aqueous hydrogen peroxide solution to remove a damaged layer, which is formed by ICP-RIE etching, on the surface of the diffraction grating layer 22a.

After the diffraction grating layers 22a and 42a are formed the n-type semiconductor layer 22b, the n-type semiconductor layer 42b (n-type InP), the core layer 23 (a lower optical confinement layer composed of undoped InGaAsP, a core layer composed of InGaAsP, and an upper optical confinement layer composed of undoped InGaAsP), the p-type semiconductor layer 24a (p-type InP), a lower capping layer composed of p-type InGaAsP, and an upper capping layer composed of p-type InP (not illustrated) are sequentially grown on the diffraction grating layers 22a and 42a. The core layer 23 is a first optical waveguide layer according to this embodiment. The n-type semiconductor layer 22b has a thickness of, for example, 120 nm. Each of the lower and upper optical confinement layers has a thickness of, for example, 50 nm. Each of the lower and upper capping layers has a thickness of, for example, 20 nm. In this way, the stacked semiconductor layer portion 32 is formed.

As illustrated in FIG. 7B, a mask M1 is formed on the stacked semiconductor layer portion 32. Specifically, an insulating layer to be formed into the mask M1 is formed on the stacked semiconductor layer portion 32. The insulating layer is composed of a dielectric material, such as $SiO_2$, SiON, and SiN. Then a portion of the insulating layer located on the semiconductor laser portion 20 is protected by a resist using a common photolithography technique. A portion of the insulating layer which is not covered with the resist is removed by etching. Then the resist is removed.

As illustrated in FIG. 8A, the stacked semiconductor layer portion 32 is etched with the mask M1 as an etching mask. Specifically, the upper capping layer, which is the uppermost layer of the stacked semiconductor layer portion 32, composed of p-type InP is selectively etched with a mixture containing hydrochloric acid, water, and acetic acid. In this etching, the lower capping layer composed of p-type InGaAsP is not substantially etched. In this case, hydrochloric acid, water, and acetic acid in the mixture are contained in proportions by volume of, for example, 1:1:10. The concentration of hydrochloric acid is, for example, 36% by weight. Next, the lower capping layer composed of p-type InGaAsP is selectively etched with a mixture containing sulfuric acid, an aqueous hydrogen peroxide solution, and water. In this case, sulfuric acid, the aqueous hydrogen peroxide solution, and water in the mixture are contained in proportions by volume of, for example, 1:1:1. The concentration of sulfuric acid is, for example, 96% by weight. Then the p-type semiconductor layer 24a is etched with a mixture containing hydrogen bromide and water. In this case, the ratio by volume of hydrogen bromide to water is, for example, 2:1. The concentration of hydrogen bromide is, for example, 47% by weight. Subsequently, the upper optical confinement layer, the active layer, and the lower optical confinement layer are selectively etched with a mixture containing hydrochloric acid, an aqueous hydrogen peroxide solution, and water. In the foregoing etching to the stacked semiconductor layer portion 32, the n-type semiconductor layer 22b (42b) functions as an etch stop layer, so that the etching is stopped at the n-type semiconductor layer 22b (42b).

As illustrated in FIG. 8B, a stacked semiconductor layer portion 52 to be formed into the waveguide portion 40 is formed on the main surface 10a of the n-type semiconductor substrate 10. Specifically, the core layer 43 (undoped InGaAsP), the p-type semiconductor layer 44a (p-type InP), a lower capping layer composed of p-type InGaAsP, and an upper capping layer composed of p-type InP (not illustrated) are selectively grown, in that order, on the n-type semiconductor layer 42b (n-type InP) while the mask M1 is left. Thereby, the stacked semiconductor layer portion 52 is formed so as to be arranged in contact with the stacked semiconductor layer portion 32 in the light propagation direction (that is, the waveguiding direction). The core layer 43 is a third optical waveguide layer according to this embodiment.

Next, the mask M1 is removed with hydrofluoric acid. As illustrated in FIG. 9A, a mask M2 is formed on the stacked semiconductor layer portions 32 and 52. Specifically, an insulating layer to be formed into the mask M2 is formed on the stacked semiconductor layer portions 32 and 52. The insulating layer is composed of a dielectric material, such as $SiO_2$, SiON and SiN. Then a portion of the insulating layer located on the semiconductor laser portion 20 and the waveguide portion 40 is protected by a resist using a common photolithography technique. A portion of the insulating layer which is not covered with the resist is removed by etching. Then the resist is removed.

As illustrated in FIG. 9B, the stacked semiconductor layer portion 52 is etched with the mask M2 as an etching mask. Specifically, the upper capping layer composed of p-type InP and the lower capping layer composed of p-type InGaAsP in the stacked semiconductor layer portion 52 are etched in the same way as when the stacked semiconductor layer portion 32 is etched. Then the p-type semiconductor layer 44a is etched in the same way as when the p-type semiconductor layer 24a is etched. Subsequently, the core layer 43 is etched with a mixture containing hydrochloric acid, an aqueous hydrogen peroxide solution, and water. In this case, hydrochloric acid, the aqueous hydrogen peroxide solution, and water are contained in proportions by volume of, for example, 1:5:5. Then the n-type semiconductor layer 42b is etched with a mixture containing hydrogen bromide and water. In this case, the ratio by volume of hydrogen bromide to water is, for example, 2:1. Subsequently, the diffraction grating layer 42a is etched with a mixture containing hydrochloric acid, an aqueous hydrogen peroxide solution, and water. In this case, hydrochloric acid, the aqueous hydrogen peroxide solution, and water are contained in proportions by volume of, for example, 1:5:5. In the case of the etching in this step, the InGaAsP semiconductor is selectively etched, and InP is not substantially etched. Thus, the etching is stopped at the InP buffer layer below the diffraction grating layer 42a or at the substrate 10.

As illustrated in FIG. 10A, a stacked semiconductor layer portion 72 to be formed into the optical modulator portion 60 is formed on the main surface 10a of the n-type semiconductor substrate 10. Specifically, the n-type semiconductor region 62 (n-type InP), the core layer 63 (undoped AlGaInAs), and the p-type semiconductor layer 64a (p-type InP) are selectively grown, in that order, on the main surface 10a while the mask M2 is left. The mask M2 is removed with hydrofluoric acid. The stacked semiconductor layer portion 72 is a second stacked semiconductor layer portion according to this embodiment. The stacked semiconductor layer portions 32, 52, and 72 are arranged linearly in the light propagation direction (that is, the waveguiding direction). The core layer 63 is a second optical waveguide layer according to this embodiment.

As illustrated in FIG. 10B, the p-type semiconductor layer 12 is grown over the stacked semiconductor layer portions 32, 52, and 72. That is, a cladding layer composed of p-type InP, an intermediate layer composed of p-type InGaAsP, and a contact layer composed of p-type InGaAs are sequentially grown on the stacked semiconductor layer portions 32, 52, and 72. A substrate product 80 is formed through the foregoing steps.

As illustrated in FIG. 11A, a mask M3 is formed on the substrate product 80. The mask M3 is a first mask according to this embodiment. The mask M3 includes a stripe-shaped pattern M31 extending in the light propagation direction (that is, the waveguiding direction); and a pair of patterns M32 and M33 arranged on both sides of the pattern M31. The pattern M31 serves as a first pattern region according to this embodiment. The patterns M32 and M33 serve as a second pattern region according to this embodiment. More specifically, the pattern M31 has a shape corresponding to the planar shapes of the stripe-shaped mesa structures 21, 41A, 41B, and 61 illustrated in FIGS. 5A, 5B, 6A, and 6B. The pattern M31 includes a pair of side edges M31a and M31b extending in the light propagation direction. The pattern M31 is arranged above the stacked semiconductor layer portions 32, 52, and 72. Meanwhile, each of the pair of patterns M32 and M33 is arranged above the stacked semiconductor layer portion 72 and partially arranged above the stacked semiconductor layer portion 52. The pattern M32 includes a side edge M32a facing the side edge M31a of a portion of the pattern M31 arranged above the stacked semiconductor layer portions 52 and 72; and an end edge M32b that extends in a direction crossing the light propagation direction (in this embodiment, a direction perpendicular to the light propagation direction). Similarly, the pattern M33 includes a side edge M33a facing the side edge M31b of a portion of the pattern M31 arranged above the stacked semiconductor layer portions 52 and 72; and an end edge M33b that extends in a direction crossing the light propagation direction (in this embodiment, a direction perpendicular to the light propagation direction). The side edges M32a and M33a serve as a first side edge of the first mask, and the end edges M32b and M33b serve as a first end edge of the first mask according to this embodiment. In this embodiment, while the end edges M32b and M33b are located above the stacked semiconductor layer portion 52, the end edges M32b and M33b rimy be located above the stacked semiconductor layer portion 72 or the stacked semiconductor layer portion 32.

For example, the mask M3 is formed as described below. An insulating layer to be formed into the mask M3 is formed above the stacked semiconductor layer portions 32, 52, and 72 (in this embodiment, on the p-type semiconductor layer 12). The insulating layer is composed of a dielectric material such as $SiO_2$, SiON, and SiN. Then portions of the insulating layer corresponding to the patterns M31 to M33 are protected by a resist using a common photolithography technique. Portions of the insulating layer which is not covered with the resist are removed by etching. Then the resist is removed.

As illustrated in FIG. 11B, the stacked semiconductor layer portions 32, 52, and 72 are etched with the mask M3 as an etching mask, thereby forming the stripe-shaped mesa structures 21 and 41A and the pair of grooves 66 and 67. As a result, the stripe-shaped mesa structures 41B and 61 are formed (mesa formation step). At this time, the terrace-like portions 65A and 65B are simultaneously formed. As an etching process in this step, dry etching is preferably employed. As the dry etching, for example, an ICP-RIE method using HI gas is more preferred. The etch depth is in the range of, for example, 3.0 μm to 4.0 μm. In this step, the stripe-shaped mesa structures 21, 41A, 41B, and 61 are simultaneously formed by a single etching process. These stripe-shaped mesa structures 21, 41A, 41B, and 61 include the core layers having different compositions (the stripe-shaped mesa structures 21, 41A, and 41B including the core layers composed of InGaAsP, and the stripe-shaped mesa structure 61 including the core layer composed of AlGaInAs). Thus, an flat etched bottom surface is preferably formed with an etching gas in which a difference in etch rate among these compositions is small. Then, the stripe-shaped mesa structures 21, 41A, 41B, and 61 have substantially the same height. After this step, only the patterns M32 and M33 are removed with hydrofluoric acid (FIG. 12A).

As illustrated in FIG. 12B, a mask M4 is formed on the substrate product 80. The mask M4 is a second mask according to this embodiment. The mask M4 covers the stripe-shaped mesa structure 61 in the stacked semiconductor layer portion 72. More specifically, the mask M4 is formed so as to cover the top of the stripe-shaped mesa structure 61, the inner surfaces of the pair of grooves 66 and 67, and the surfaces of the terrace-like portions 65A and 65B. The mask M4 includes a pair of side edges M4$a$ and M4$b$ along the light propagation direction; and end edges M4$c$ extending in a direction crossing the light propagation direction. The side edges M4$a$ and M4$b$ serve as a second side edge of the second mask, and the end edges M4$c$ serve as a second end edge of the second mask according to this embodiment. The end edges M4$c$ are located on the side of the stacked semiconductor layer portion 72 in the light propagation direction with respect to the position of the end edges M32$b$ and M33$b$ of the mask M3 illustrated in FIG. 11A. In other words, the end edges M4$c$ are located on the side of the stacked semiconductor layer portion 72 with respect to a line defined by the end surfaces 65Aa and 65Ba of the terrace-like portions 65A and 65B. As illustrated in FIG. 12B, portions of the pair of grooves 66 and 67 near the stacked semiconductor layer portion 32 are exposed without being covered with the mask M4. The end edges M4$c$ may be located at any position above the stacked semiconductor layer portions 52 and 72.

In this embodiment, the mask M4 includes the side edges M4$a$ and M4$b$, which define the limitation of the width of the mask M4 in a direction crossing the light propagation direction. Thus, surfaces of regions of the terrace-like portions 65A and 65B remote from the stripe-shaped mesa structure 61 are also exposed without being covered with the mask M4. The spacing between the side edges. M4$a$ and M4$b$ is, for example, 10 μm.

For example, the mask M4 is formed as described below. An insulating layer to be formed into the mask M4 is formed on the entire surface of the substrate product 80 so as to have a thickness of, for example, 50 nm. The insulating layer is composed of a dielectric material such as $SiO_2$, SiON, and SiN. Then a portion of the insulating layer corresponding to the mask M4 is protected by a resist using a common photolithography technique. A portion of the insulating layer which is not covered with the resist is removed by, for example, wet etching with hydrofluoric acid. Then the resist is removed.

The mask M4 and the mask M3 are preferably composed of different materials. For example, the mask M3 may be composed of $SiO_2$, and the mask M4 may be composed of SiN having a higher etch rate than $SiO_2$. In this case, the mask M4 is formed by wet etching with hydrofluoric acid, so that the etch rate of the mask M4 can be higher than that of the mask M3. The thickness of the mask M4 is preferably minimized to the extent that the coverage of the stripe-shaped mesa structure 61 is not impaired. It is thus possible to inhibit a reduction in the thickness of the stripe-shaped pattern M31 of the mask M3 when the SiN layer is etched to form the mask M4. As a result, a state in which the mask M3 is arranged can be maintained on the stripe-shaped mesa structure 21 in the subsequent step of selectively growing a buried semiconductor layer. It is thus possible to suitably prevent the growth of a semiconductor layer on the stripe-shaped mesa structure 21.

Figure 13:
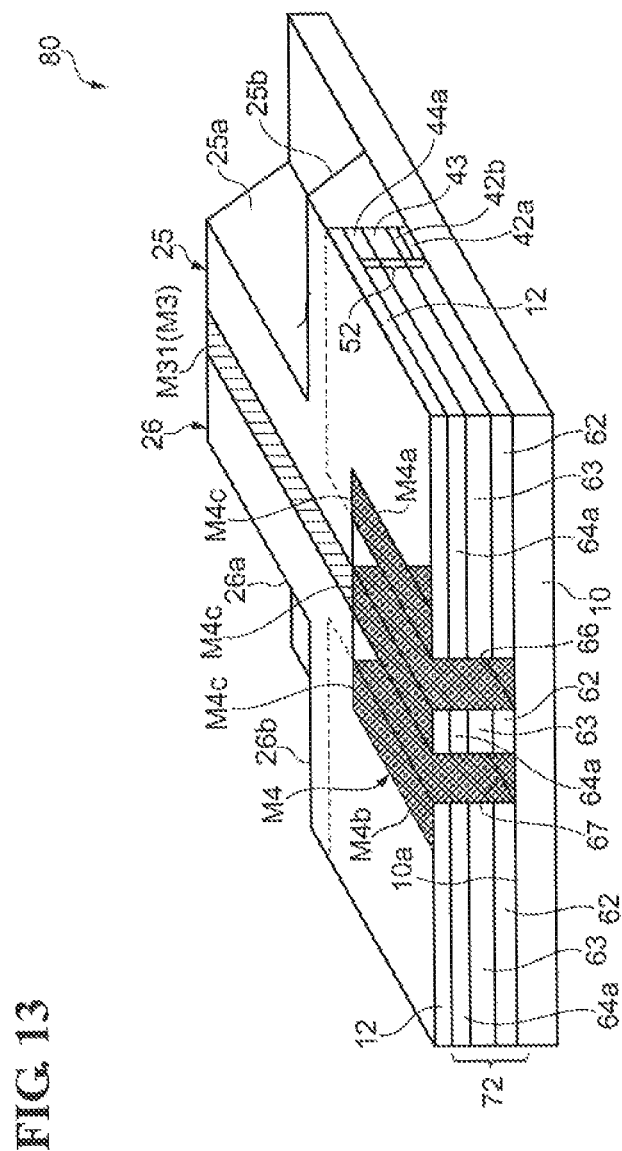
FIG. 13 is a perspective view illustrating a step of selectively growing a buried semiconductor layer in a production method according to an embodiment.
Figure 18:
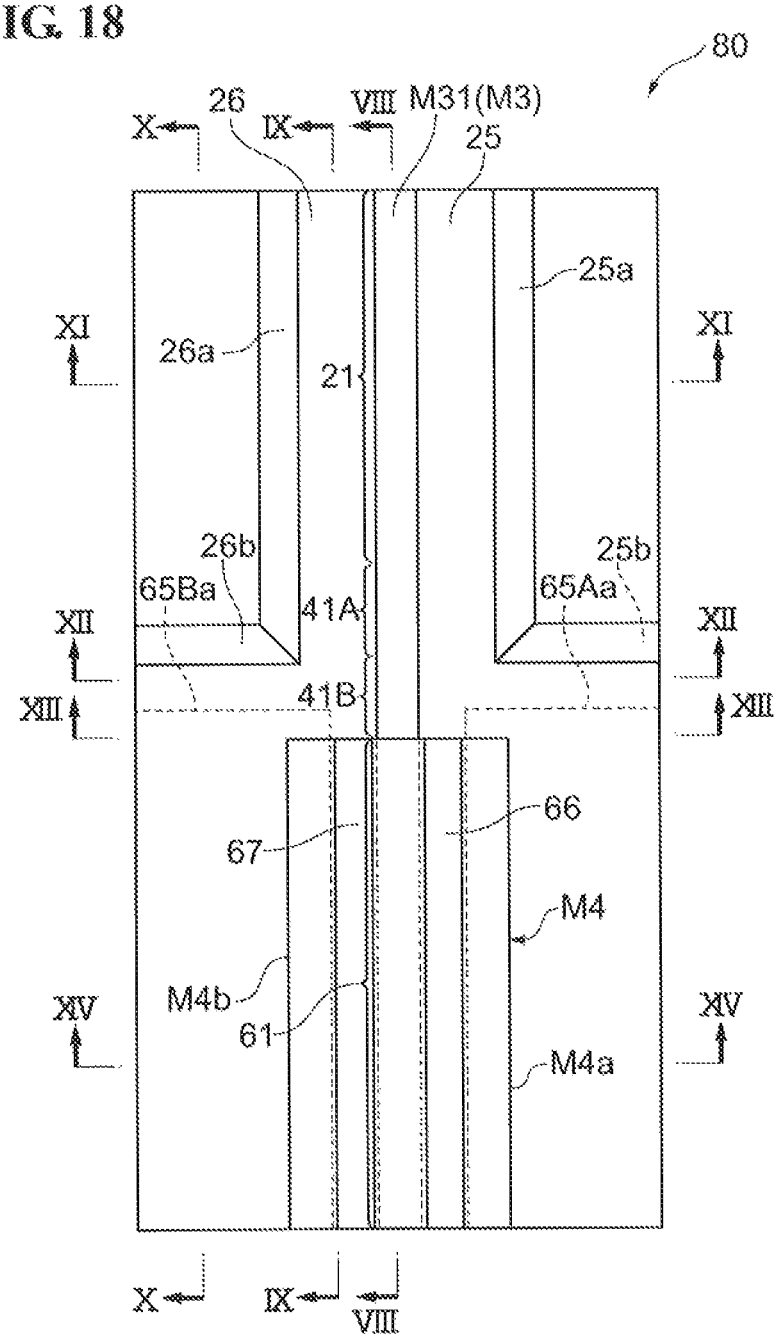
FIG. 18 is a plan view illustrating a state of a substrate product immediately after the formation of a semiconductor-buried portion.
Figure 19:
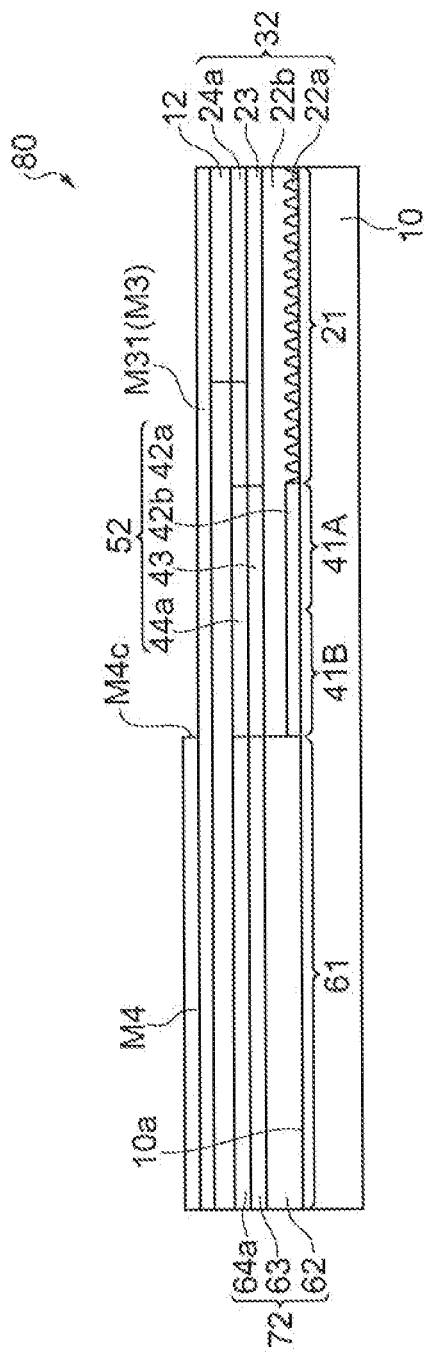
FIG. 19 is a cross-sectional view of the substrate product taken along line VIII-VIII in FIG. 18 and illustrates a cross section in the light propagation direction.
Figure 20:
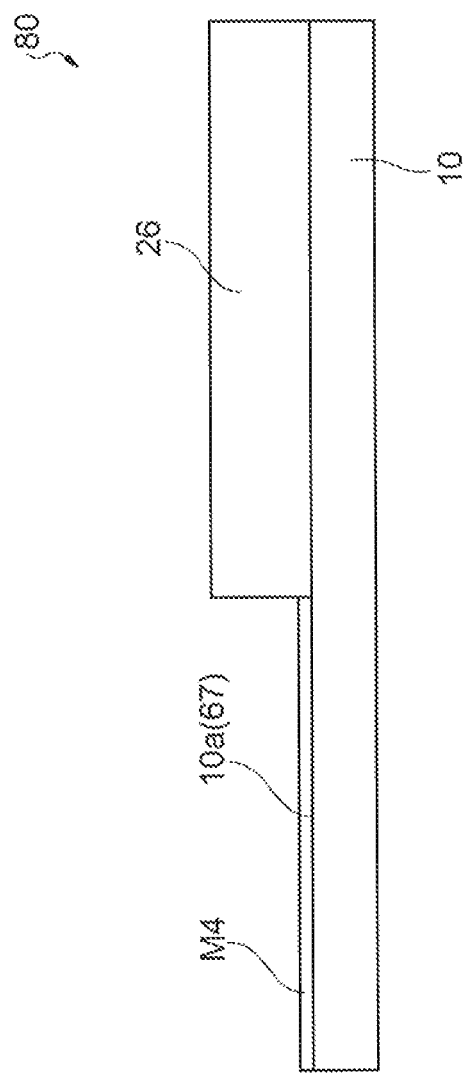
FIG. 20 is a cross-sectional view of the substrate product taken along line IX-IX in FIG. 18 and illustrates a cross section in the light propagation direction.
Figure 21:
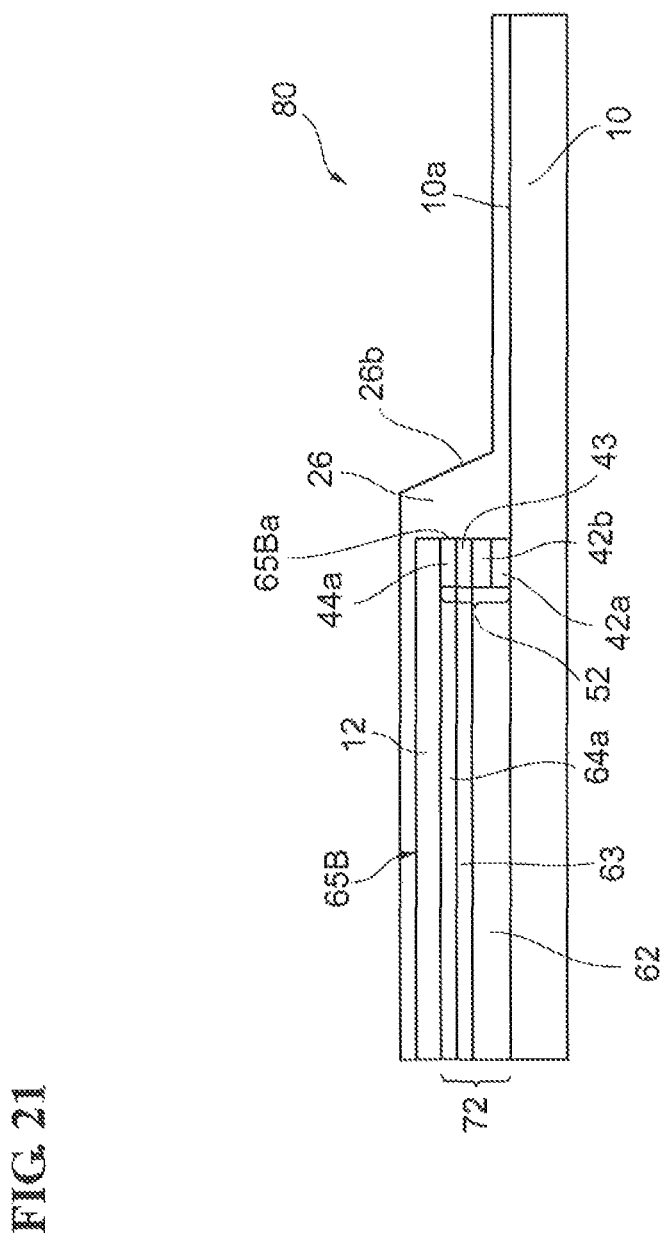
FIG. 21 is a cross-sectional view of the substrate product taken along line X-X in FIG. 18 and illustrates a cross section in the light propagation direction.
Figure 22A:
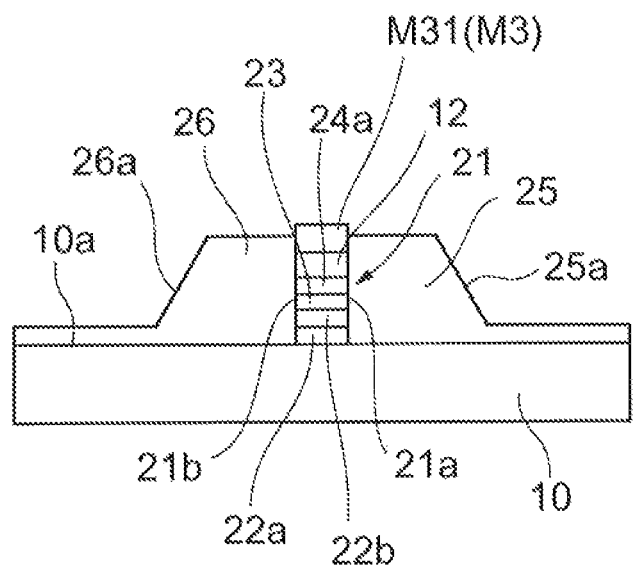
FIGS. 22A and 22B are cross-sectional views of the substrate product taken along lines XI-XI and respectively, in FIG. 18 and illustrate cross sections perpendicular to the light propagation direction.
Figure 22B:
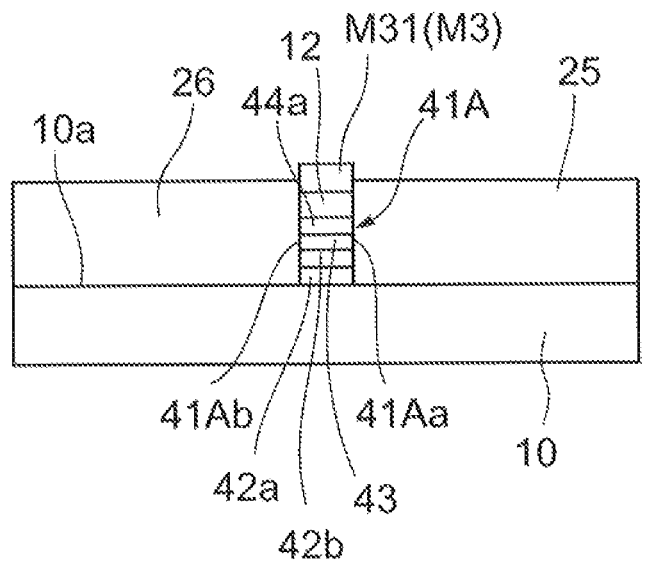
Figure 23A:
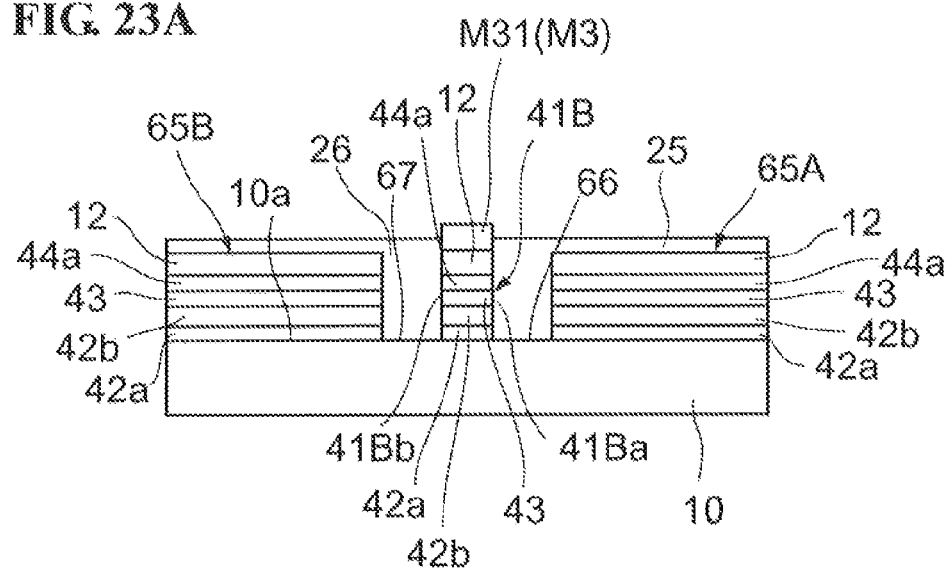
FIGS. 23A and 23B are cross-sectional views of the substrate product taken along lines XIII-XIII and XIV-XIV, respectively, in FIG. 18 and illustrate cross sections perpendicular to the light propagation direction.
Figure 23B:
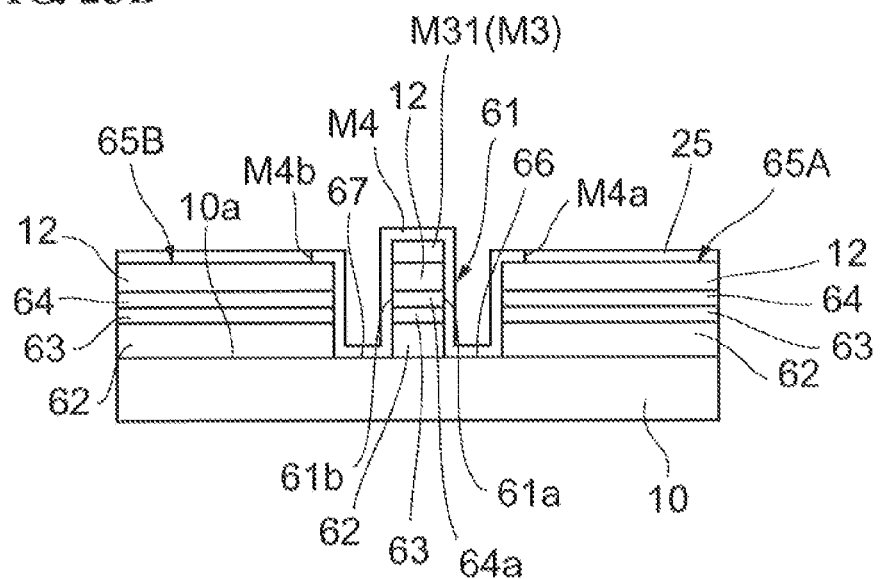
Figure 24:
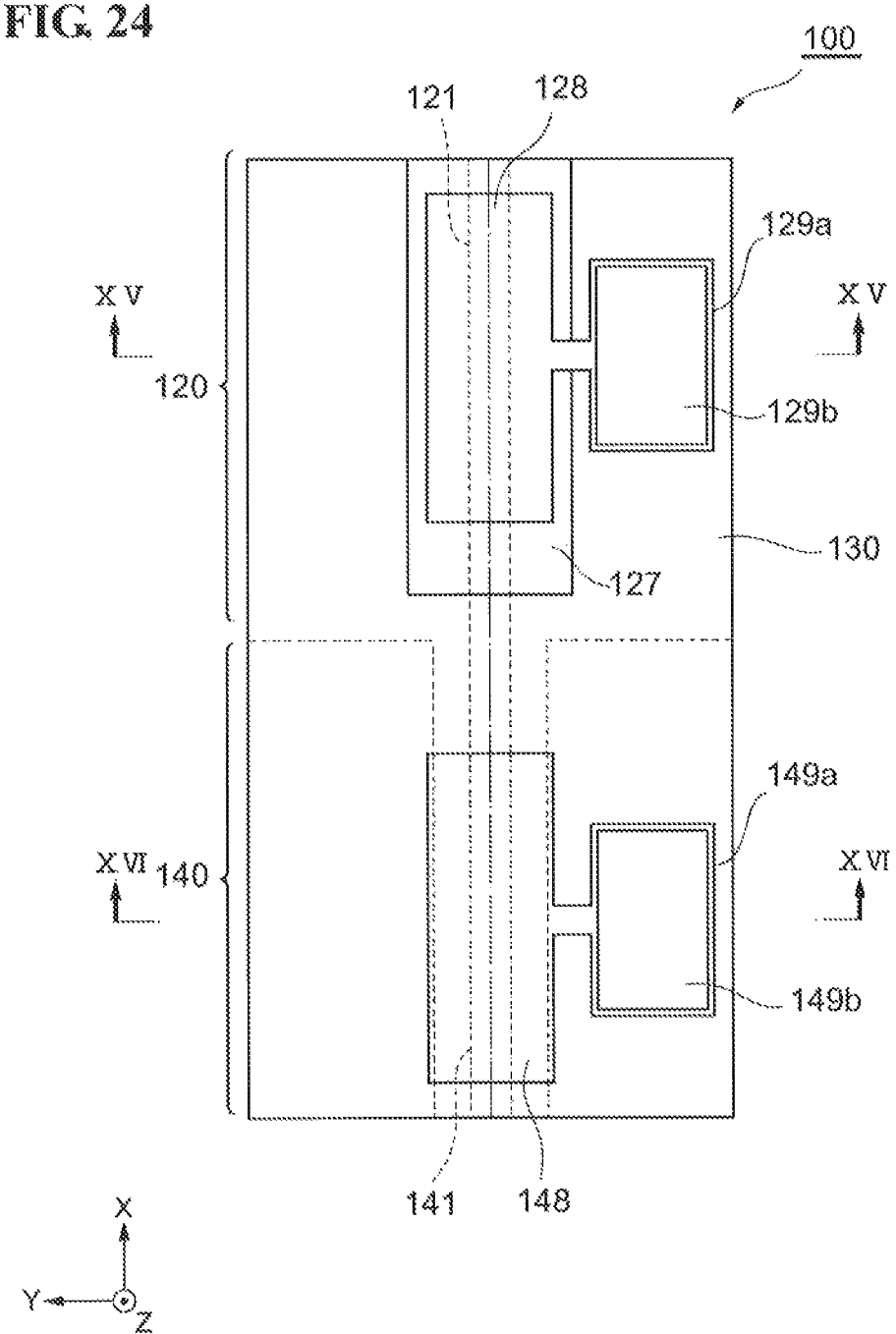
FIG. 24 is a plan view of an example of a semiconductor optical integrated device having a structure in which stripe-shaped mesa structures of a semiconductor laser portion and an optical modulator portion are buried in different buried layers.
Figure 25A:
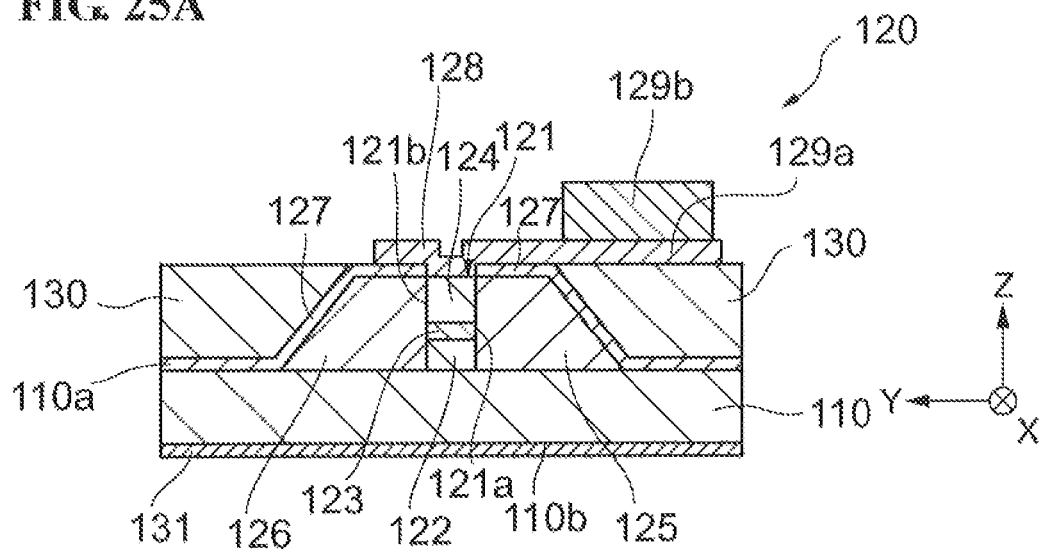
FIGS. 25A and 25B are cross-sectional views of the semiconductor optical integrated device taken along lines XV-XV and XVI-XVI in FIG. 24.
Figure 25B:
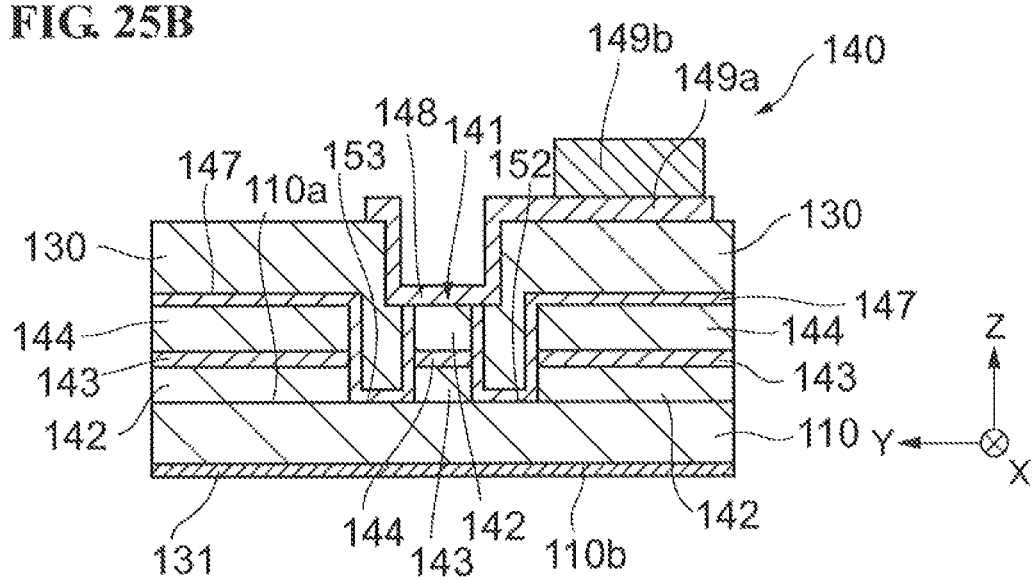
Figure 26:
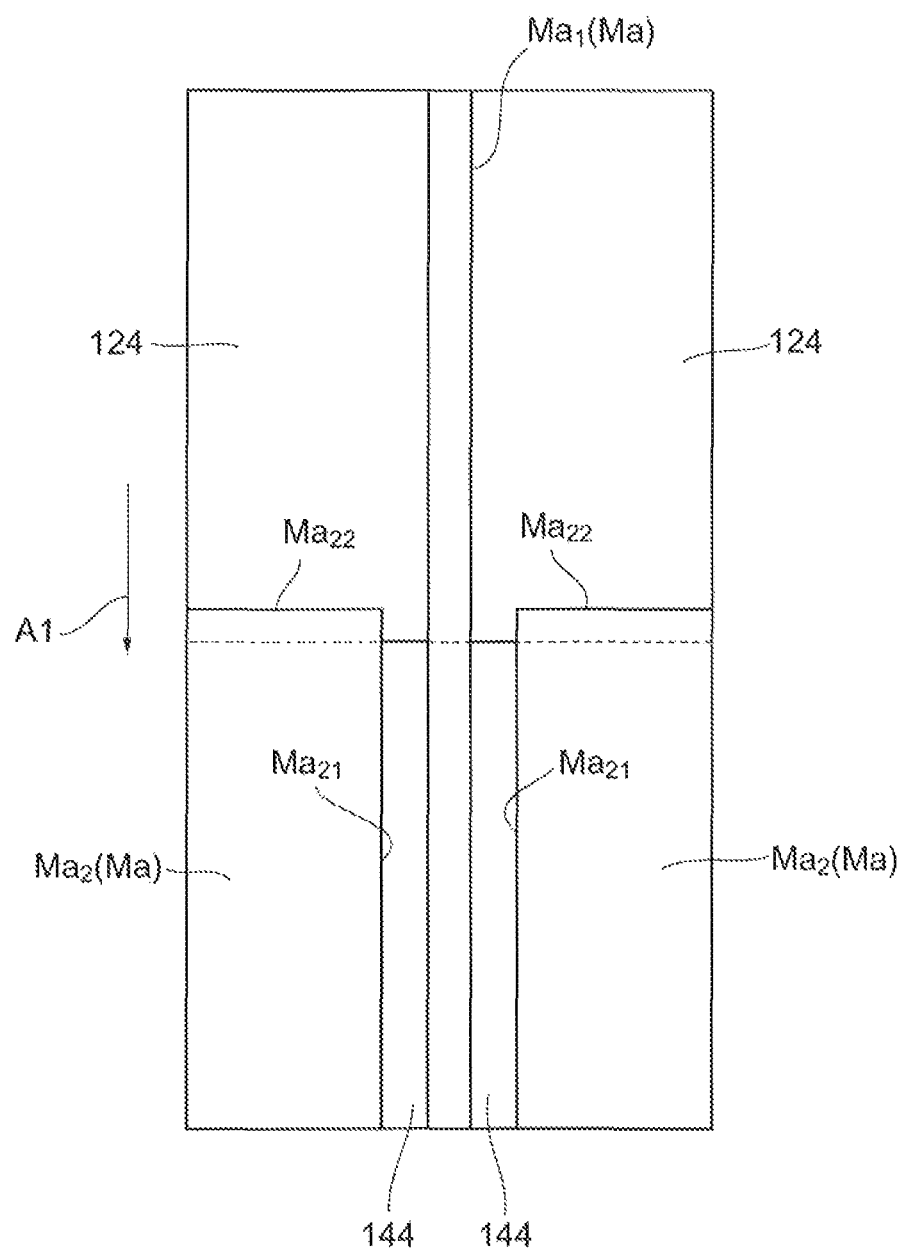
FIG. 26 is a plan view illustrating the shape of a mask used to form a stripe-shaped mesa structure.

As illustrated in FIG. 13, a semi-insulating semiconductor layer composed of, for example, Fe-doped InP is selectively grown on a region that is not covered with the mask M4. Both side surfaces of each of the stripe-shaped mesa structures 21, 41A, and 41B are buried by the semi-insulating semiconductor layer, thereby forming the semiconductor-buried portions 25 and 26. That is, the semiconductor-buried portions 25 and 26 serve as a buried semiconductor layer according to this embodiment. Here, FIG. 18 is a plan view illustrating a state of the substrate product 80 immediately after the formation of the semiconductor-buried portions 25 and 26. FIGS. 19, 20, and 21 are cross-sectional views of the substrate product 80 taken along lines VIII-VIII, IX-IX, and X-X, respectively, in FIG. 18 and illustrate cross sections in the light propagation direction. FIGS. 22A, 22B, 23A, and 23B, are cross-sectional views of the substrate product 80 taken along lines XI-XI, XII-XII, XIII-XIII, and XIV-XIV, respectively, in FIG. 18 and illustrate cross sections normal to the light propagation direction.

As illustrated in FIGS. 13 and 18 to 23B, in this step, both side surfaces of each of the stripe-shaped mesa structures 21 and 41A are buried by the semiconductor-buried portions 25 and 26. In addition, the end surfaces 65Aa and 65Ba of the terrace-like portions 65A and 65B are buried by the semiconductor-buried portions 25 and 26. Furthermore, the semiconductor-buried portions 25, and 26 are grown on portions of the pair of grooves 66 and 67, so that both side surfaces of each of the stripe-shaped mesa structures 41B and 61 are buried by the semiconductor-buried portions 25 and 26. In this step, when Fe-doped InP is grown as the semiconductor-buried portions 25 and 26, the growth is preferably performed while 1,2-dichloroethane is supplied. This results in an increase in growth rate on both side surfaces of each of the stripe-shaped mesa structures 21 and 41A and the end surfaces 65Aa and 65Ba of the terrace-like portions 65A and 65B, compared with the growth rate on the main surface 10$a$ of the n-type semiconductor substrate 10. This facilitates the formation of the inclined surfaces 25$b$ and 26$b$ of the semiconductor-buried portions 25 and 26 illustrated in FIGS. 1 and 4 and the side surfaces 25$a$ and 26$a$ illustrated in FIG. 5A. After this step, the patterns M31 of the mask M3 and the mask. M4 are removed with hydrofluoric acid (FIG. 14A).

As illustrated in FIG. 14B, an insulating layer is formed on the entire surface of the substrate product 80. The insulating layer is composed of a dielectric material such as $SiO_2$, SiON, and SiN. Thereby, the protective film 14 is formed. The protective film 14 has a thickness of, for example, 250 nm.

Figure 15A:
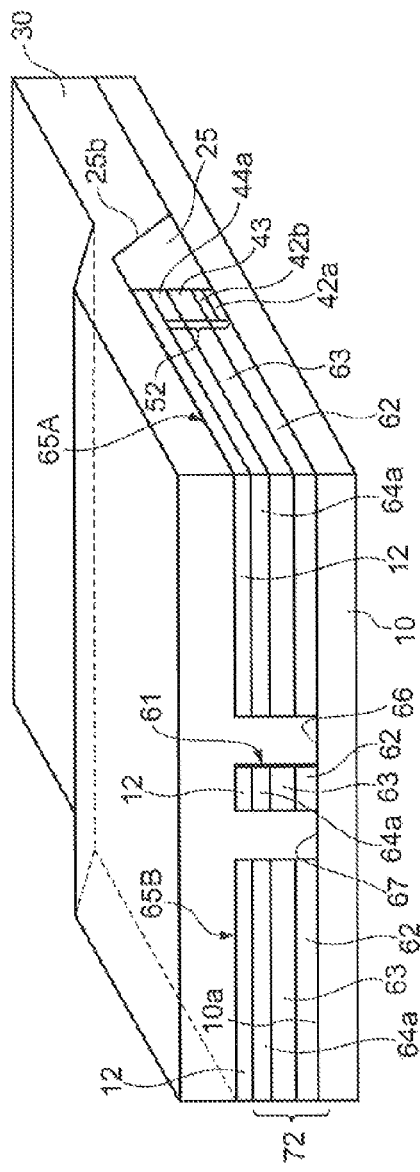
FIGS. 15A and 15B are perspective views illustrating steps of forming a resin region in a production method according to an embodiment.

As illustrated in FIG. 15A, a resin is applied to the substrate product 80 and cured to form the resin region 30. Both side surfaces of the stripe-shaped mesa structure 61 are buried by the resin region 30. In the case of forming the resin region 30, the resin is applied to the entire surface of the substrate product 80 by spin coating. Thus, the resin region 30 is formed on the pair of grooves 66 and 67, the stripe-shaped mesa structure 61, the terrace-like portions 65A and 65B, and regions of the main surface 10a located outside the side surfaces 25a and 26a of the semiconductor-buried portions 25 and 26. As illustrated in FIG. 15A, the height of a portion of the resin region 30 arranged on both sides of each of the stripe-shaped mesa structures 21 and 41A is different from the height of a portion of the resin region 30 arranged on both sides of each of the stripe-shaped mesa structures 41B and 61, the difference being attributed to the presence or absence of the terrace-like portions 65A and 65B. The resin region 30 is composed of, for example, benzocyclobutene (BCB) resin or polyimide resin. These resin materials may be processed by dry etching, such as reactive ion etching (RIE), with $O_2$ gas as an etching gas. The resin region 30 has a thickness of, for example, 3 μm to 4 μm.

Figure 15B:
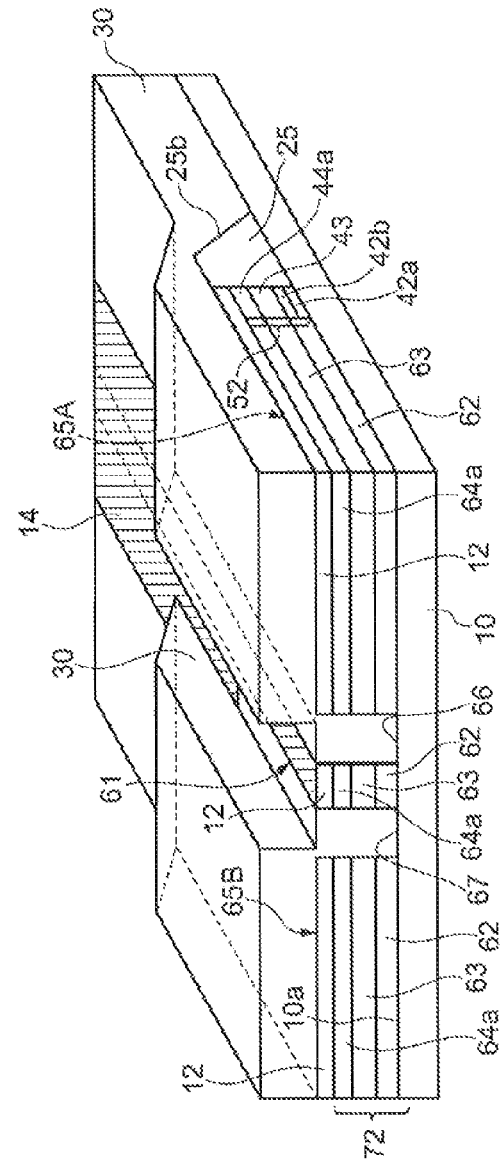

As illustrated in FIG. 15B, an opening 30a is formed in the resin region 30 to expose the protective film 14 on the stripe-shaped mesa structures 21, 41A, 41B, and 61. Specifically, a resist is applied to the surface of the resin region 30. A resist mask corresponding to the planar shape of the opening 30a is formed by a common photolithography technique. Next, the resin region 30 is etched by RIE with, for example, $O_2$ gas or $CF_4$ gas with the resist mask. In this case, the etch depth is such that the protective film 14 is exposed. Furthermore, it is possible to enhance the etch selectivity of the resin region 30 to the protective film 14 by performing RIE with $O_2$ gas.

In this embodiment, the thickness of the portion of the resin region 30 arranged on the stripe-shaped mesa structures 21 and 41A is significantly different from the thickness of the portion of the resin region 30 arranged on the stripe-shaped mesa structures 41B and 61. It is thus preferred that the portions of the resin region 30 be separately subjected to the formation of a resist mask and etching. With respect to a portion above the stacked semiconductor layer portion 72 to be formed into the optical modulator portion, a portion of the resin region 30 arranged on the terrace-like portions 65A and 65B is not etched. Only a portion of the resin region 30 arranged on the stripe-shaped mesa structure 61 is preferably etched. This reduces parasitic capacitance due to the subsequently formed metal film 68b for a wiring electrode, thereby improving the high-frequency characteristics of the optical modulator portion.

Figure 16A:
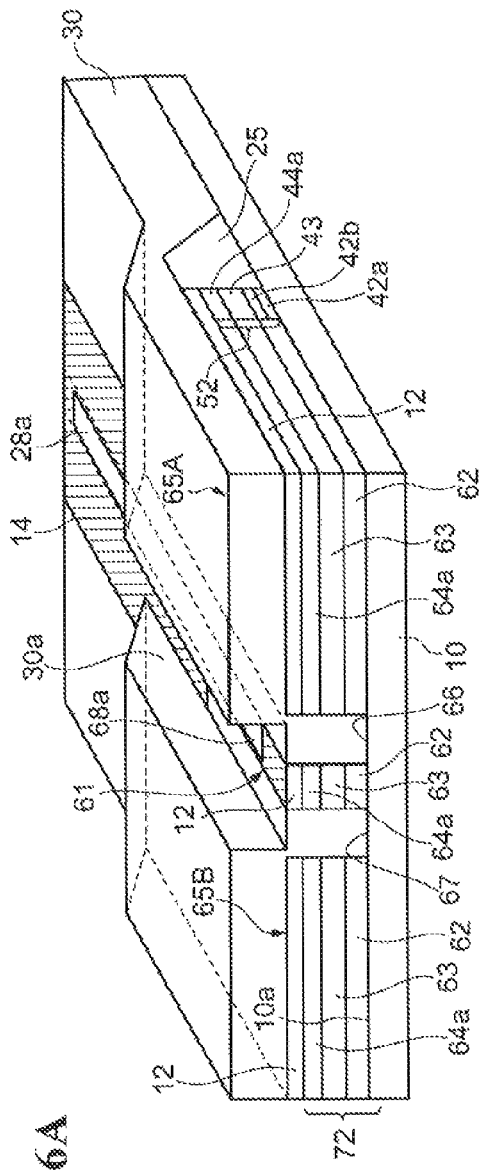
FIGS. 16A and 16B are perspective views illustrating steps of a production method according to an embodiment.

As illustrated in FIG. 16A, an opening (contact hole) is formed in a portion of the protective film 14 arranged oil the stripe-shaped mesa strictures 21 and 61. Next, the ohmic metal film 28a and the ohmic metal film 68a are formed in the opening. To form the opening in the protective film 14, a resist mask having a pattern corresponding to the planar shape of the opening is formed by a photolithography technique. Then the protective film 14 is etched with the resist mask to suitably form the opening, in the protective film 14. To form the ohmic metal films 28a and 68a, metal layers of Au/Zn/Au are formed by evaporation while the resist mask is left. Then the metal layers deposited the resist mask are removed together with the resist mask (what is called a lift-off method). The ohmic metal films 28a and 68a are suitably formed by the lift-off method.

Figure 16B:
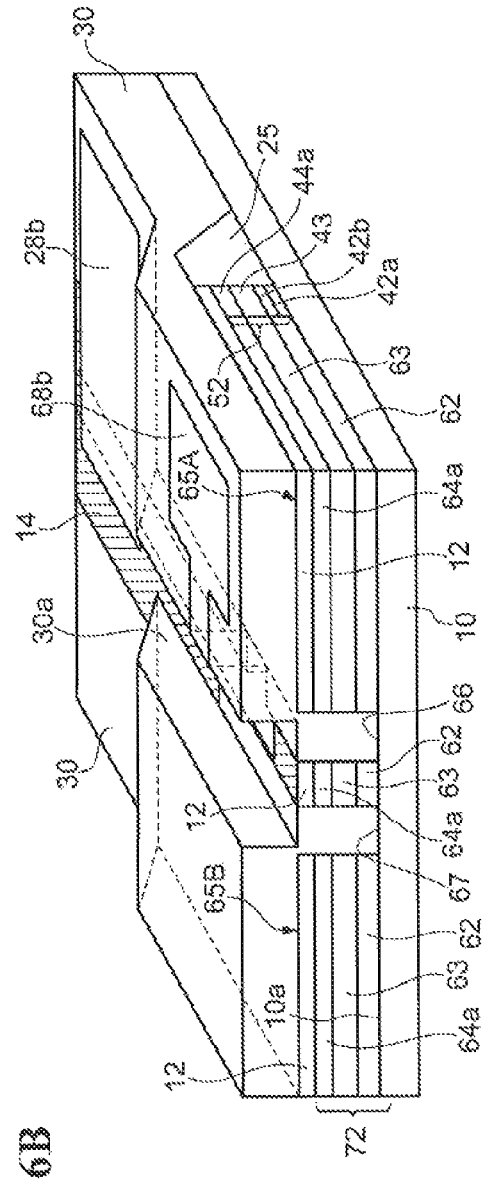

As illustrated in FIG. 16B, the metal film 28b for a wiring electrode is formed so as to extend from the ohmic metal film 28a to a portion of the resin region 30. The metal film 68b for a wiring electrode is formed so as to extend from the ohmic metal film 68a to a portion of the resin region 30. To form the metal films 28b and 68b for wiring electrodes, resist mask having a pattern corresponding to planar shapes of the metal films 28b and 68b for wiring electrodes is formed by a photolithography technique. Then metal layers of Ti/Pt/Au are formed by evaporation. The metal layers deposited on the resist mask are removed together with the resist mask by a lift-off method. Thereby, the metal films 28b and 68b for wiring electrodes are suitably formed.

As illustrated in FIG. 17A, the wire bonding pads 28c and 68c are formed on portions of the metal films 28b and 68b for wiring electrodes arranged on the resin region 30. To form the wire bonding pads 28c and 68c, for example, a current-carrying Au film required to form a plating film is formed by evaporation on the entire surface of the substrate product 80. A pattern corresponding to the wire bonding pads 28c and 68c is formed on the Au film by a photolithography technique. Then Au plating is performed, thereby suitably forming the wire bonding pads 28c and 68c. After the formation of the wire bonding pads 28c and 68c, Au deposited on the entire surface of the substrate product 80 is etched to remove the current-carrying Au film.

As illustrated in FIG. 17B, the ohmic metal film 13 is formed on the entire back surface 10b of the n-type semiconductor substrate 10. Specifically, the main-surface side of the substrate product 80 is bonded to a support plate. The back surface 10b of the n-type semiconductor substrate 10 is then polished. After the polishing, the n-type semiconductor substrate 10 has a thickness of 100 μm to 200 μm. Next, metal layers of AuGe/Ti/Pt/Au are formed by evaporation. The substrate product 80 is removed from the support plate and subjected to heat treatment at 300° C. to 400° C. to alloy the ohmic metal layers. Thereby, the semiconductor optical integrated device 1A illustrated in FIGS. 1 to 6B is completed.

Figure 27:
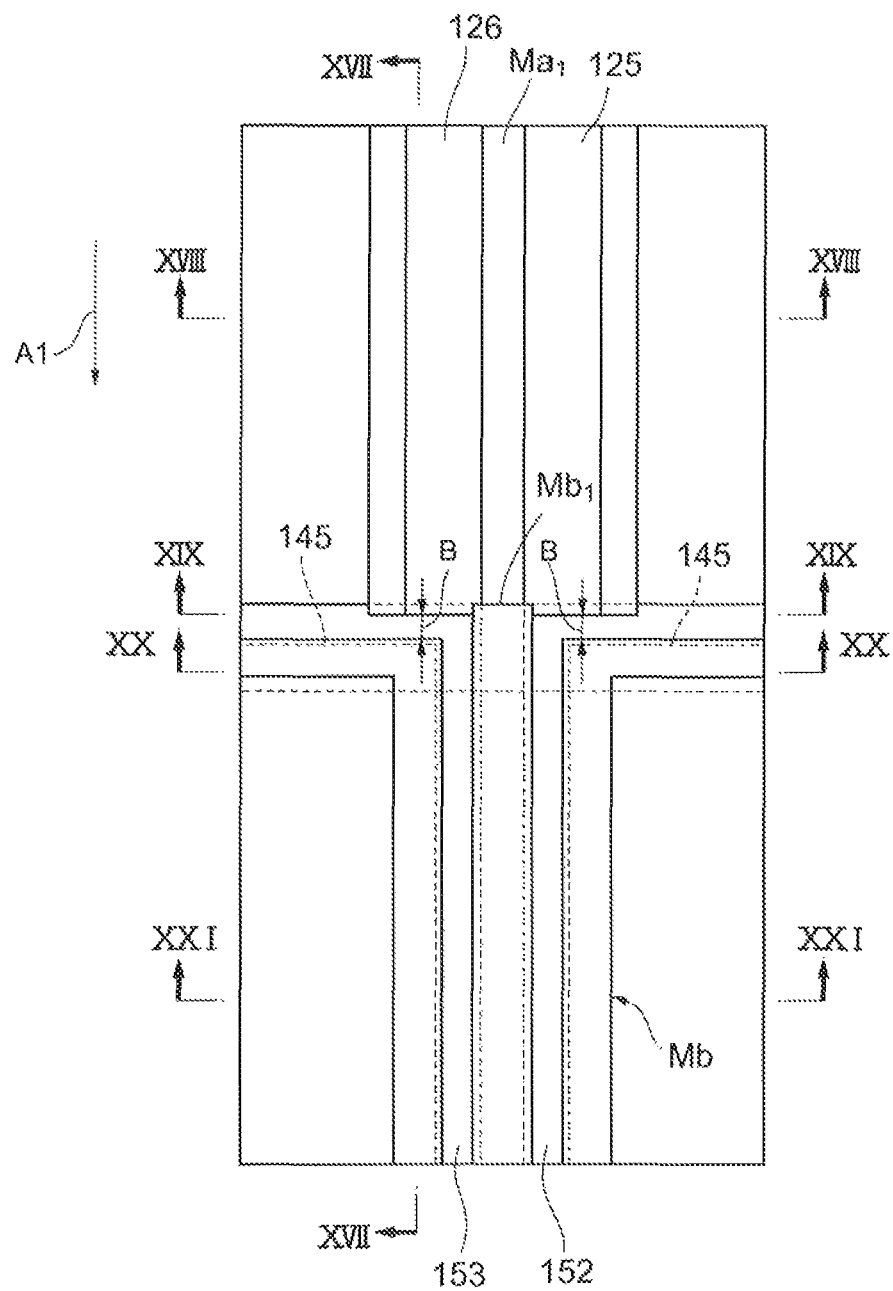
FIG. 27 is a plan view illustrating the shape of a mask used for the selective growth of a semiconductor-buried portion.
Figure 29A:
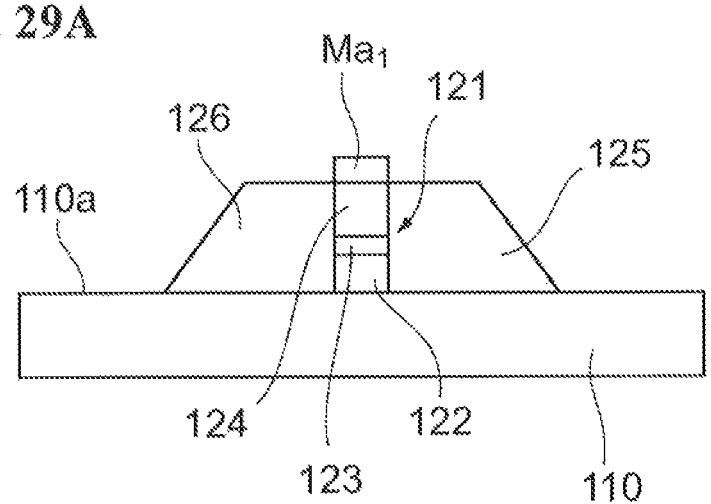
FIGS. 29A and 29B are cross-sectional views taken along lines XVIII-XVIII and XIX-XIX, respectively, in FIG. 27.
Figure 29B:
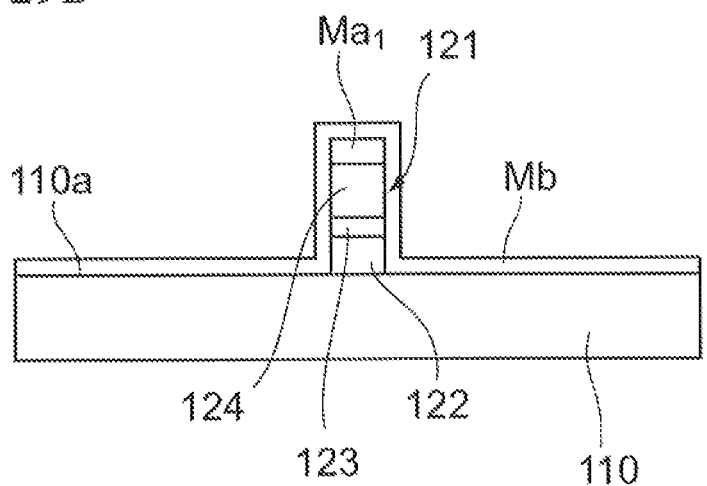

Advantageous effects provided by the foregoing method for producing the semiconductor optical integrated device 1A according to this embodiment will be described below. In the production method according to this embodiment, the mask M3 used in the mesa formation step includes the pattern M31 extending in the light propagation direction; and the patterns M32 and M33 (see FIG. 11A). The patterns M32 and M33 include the side edges M32a and M33a facing a portion of the pattern M31 arranged above the stacked semiconductor layer portion 72; and the end edges M32b and M33b extending in a direction crossing the light propagation direction. The mask M4 used in the step of selectively growing a buried semiconductor layer includes the end edges M4c located on the side of the stacked semiconductor layer portion 72 with respect to the end edges M32b and M33b of the mask M3 in the light propagation direction (see FIG. 12B). The mask M4 does not cover the end surfaces 65Aa and 65Ba of the terrace-like portions 65A and 65B and their vicinities formed by the end edges M32b and M33b of the mask M3. Thus, the semiconductor-buried portions 25 and 26 are grown also on the end surfaces 65Aa and 65Ba, so that the gaps B as illustrated in FIG. 27 are not formed between the end surfaces 65Aa and 65Ba and the semiconductor-buried portions 25 and 26. In the production method according to this embodiment, it is thus possible to enhance the surface flatness of the resin region 30 when both side surfaces of the stripe-shaped mesa structure 61 in the stacked semiconductor layer portion 72 are buried by the resin region 30. Furthermore, it is possible to form the uniform protective film 14 on and near the end surfaces 65Aa and 65Ba.

As described in this embodiment, the mask M4 preferably includes the side edges M4a and M4b extending in the light propagation direction. When the semiconductor-buried portions 25 and 26 are selectively grown, a by-product from the semiconductor material is formed on the mask. The use of a mask having a large area that covers the whole of the stacked semiconductor layer portion 72 increases the amount of the by-product on the mask, thereby affecting the growth of the semiconductor-buried portions 25 and 26. Furthermore, the amount of a semiconductor material deposited is increased in the vicinity of the boundary of the mask, thereby increasing the step height between the semiconductor-buried portions 25 and 26 and their peripheries. In contrast, the mask M4 includes the side edges M4a and M4b extending in the light propagation direction (that is, the mask M4 is formed so as to be limited to the vicinity of the stripe-shaped mesa structure 61 in the stacked semiconductor layer portion 72), thereby reducing the amount of the by-product as described above and suitably growing the semiconductor-buried portions 25 and 26.

As described in this embodiment, preferably, the semiconductor-buried portions 25 and 26 are composed of Fe-doped InP, and the semiconductor-buried portions 25 and 26 are grown while 1,2-dichloromethane is supplied. In this case, it is possible to suitably grow the semiconductor-buried portions 25 and 26 on the side surfaces 21a and 21b of the stripe-shaped mesa structure 21 in the stacked semiconductor layer portion 32 and on the end surfaces 65Aa and 65Ba of the terrace-like portions 65A and 65B.

As described in this embodiment, preferably, the stripe-shaped mesa structure 61 in the optical modulator portion includes the pair of grooves 66 and 67, and the terrace-like portions 65A and 65B are arranged outside the pair of grooves 66 and 67. In this case, the volume of the resin in which the stripe-shaped mesa structure 61 is buried is reduced, thereby reducing the internal stress due to the change in the volume of the resin. It is thus possible to effectively prevent the detachment of the metal film 68b for a wiring electrode from the surface of the resin region 30.

A semiconductor optical integrated device according to the present invention is not limited to the foregoing embodiment. Various changes may be made. For example, in the foregoing embodiment, the semiconductor optical integrated device including the active layer and so forth that are composed of III-V group compound semiconductors is exemplified. The present invention is also applicable to a semiconductor laser device composed of other semiconductors.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing a semiconductor optical integrated device, comprising the steps of:
    forming a substrate product including a first stacked semiconductor layer portion and a second stacked semiconductor layer portion that are arranged in a predetermined direction;
    forming a first mask on the first and second stacked semiconductor layer portions, the first mask including a first pattern region and a second pattern region, the first pattern region having a stripe shape that extends in the predetermined direction, the second pattern region including a first side edge and a first end edge, the first side edge facing a portion of the first pattern region arranged on the second stacked semiconductor layer portion, and the first end edge extending in a direction crossing the predetermined direction;
    forming a stripe-shaped mesa structure by etching the first and second stacked semiconductor layer portions with the first mask;
    removing the second pattern region of the first mask to expose a surface of the second stacked semiconductor layer portion;
    forming a second mask on the second stacked semiconductor layer portion, the second mask covering the upper portion and both side surfaces of the stripe-shaped mesa structure in the second stacked semiconductor layer portion;
    selectively growing a buried semiconductor layer on both side surfaces of the stripe-shaped mesa structure in the first stacked semiconductor layer portion with the first and second masks; and
    forming a resin region on both side surfaces of the stripe-shaped mesa structure in the second stacked semiconductor layer portion,
    wherein the second mask includes a second end edge separated from the first end edge of the first mask, the second end edge being located on the side of the second stacked semiconductor layer portion in the predetermined direction with respect to the first end edge of the first mask.

2. The method for producing a semiconductor optical integrated device according to claim 1,
    wherein in the step of forming the stripe-shaped mesa structure, a terrace-like portion corresponding to the second pattern region of the first mask is formed, and a pair of grooves extending in the predetermined direction is formed, the pair of grooves being arranged between the stripe-shaped mesa structure and the terrace-like portion, and
    wherein in the step of selectively growing the buried semiconductor layer, an end surface of the terrace-like portion extending in a direction crossing the predetermined direction and part of the pair of grooves are buried by the buried semiconductor layer.

3. The method for producing a semiconductor optical integrated device according to claim 1,
    wherein the second mask further includes a second side edge on the second stacked semiconductor layer portion, the second side edge extending in the predetermined direction, and
    the second side edge defines the width of the second mask in a direction crossing the predetermined direction.

4. The method for producing a semiconductor optical integrated device according to claim 1,
    wherein the second mask is composed of a dielectric material different from a material constituting the first mask, and
    wherein the second mask is formed by an etching process, the etch rate of the second mask being higher than the etch rate of the first mask.

5. The method for producing a semiconductor optical integrated device according to claim 4,
    wherein the first mask is composed of $SiO_2$,
    the second mask is composed of SiN, and
    the etching process is performed by wet etching with hydrofluoric acid.

6. The method for producing a semiconductor optical integrated device according claim 1,
   wherein the buried semiconductor layer is composed of Fe-doped InP, and
   in the step of selectively growing the buried semiconductor layer, the buried semiconductor layer is grown with supplying 1,2-dichloroethane.

7. The method for producing a semiconductor optical integrated device according to claim 1,
   wherein the resin region is composed of a benzocyclobutene resin or a polyimide resin.

8. The method for producing a semiconductor optical integrated device according to claim 1, further comprising the steps of:
   after selectively growing the buried semiconductor layer, removing the first mask and the second mask, and then forming a protective film on a surface of the substrate product;
   after forming the resin region, etching the resin region to expose the protective film on the stripe-shaped mesa structure;
   forming an opening in the protective film on the stripe-shaped mesa structure by etching the protective film using the resin region as a mask; and
   forming an electrode in the opening.

9. The method for producing a semiconductor optical integrated device according to claim 1, wherein the first stacked semiconductor layer portion has a first optical waveguide layer, and the second stacked semiconductor layer portion has a second optical waveguide layer optically connected to the first optical waveguide layer.

10. The method for producing a semiconductor optical integrated device according to claim 1,
    wherein the substrate product includes a third stacked semiconductor layer portion located between the first and second stacked semiconductor layer portions,
    wherein the first pattern region of the first mask is formed on the first, second and third stacked semiconductor layer portions of the substrate product, the second pattern region of the first mask is formed on the second stacked semiconductor layer portion and partially formed on the third stacked semiconductor layer portion,
    wherein the first end edge of the first mask is located on the third stacked semiconductor layer portion, and
    wherein the second end edge of the second mask is located on the side of the second stacked semiconductor layer portion in the predetermined direction with respect to the first end edge of the first mask.

11. The method for producing a semiconductor optical integrated device according to claim 10,
    wherein the first stacked semiconductor layer portion has a first optical waveguide layer, the second stacked semiconductor layer portion has a second optical waveguide layer, and the third stacked semiconductor layer portion has a third optical waveguide layer, and
    wherein the first, second and third optical waveguide layers are optically connected to each other.

* * * * *